(12) United States Patent
Ryu et al.

(10) Patent No.: US 11,594,544 B2
(45) Date of Patent: Feb. 28, 2023

(54) SEMICONDUCTOR DEVICES WITH STRING SELECT CHANNEL FOR IMPROVED UPPER CONNECTION

(71) Applicant: SAMSUNG ELECTRONICS CO., LTD., Suwon-si (KR)

(72) Inventors: Hyojoon Ryu, Hwaseong-si (KR); Younghwan Son, Hwaseong-si (KR); Seogoo Kang, Seoul (KR); Jesuk Moon, Hwaseong-si (KR); Junghoon Jun, Hwaseong-si (KR); Kohji Kanamori, Seongnam-si (KR); Jeehoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 159 days.

(21) Appl. No.: 16/942,456

(22) Filed: Jul. 29, 2020

(65) Prior Publication Data
US 2021/0143160 A1 May 13, 2021

(30) Foreign Application Priority Data
Nov. 13, 2019 (KR) .......................... 10-2019-0145092

(51) Int. Cl.
*H01L 27/1157* (2017.01)
*H01L 27/11582* (2017.01)
*H01L 27/11573* (2017.01)
*H01L 27/11565* (2017.01)

(52) U.S. Cl.
CPC .... *H01L 27/1157* (2013.01); *H01L 27/11565* (2013.01); *H01L 27/11573* (2013.01); *H01L 27/11582* (2013.01)

(58) Field of Classification Search
CPC ......................................... H01L 27/115–11597
See application file for complete search history.

(56) References Cited

U.S. PATENT DOCUMENTS

| | | | |
|---|---|---|---|
| 8,730,727 | B2 | 5/2014 | Yoo et al. |
| 9,972,640 | B1 | 5/2018 | Kai et al. |
| 10,181,341 | B1 | 1/2019 | Sakui |
| 10,290,650 | B1 | 5/2019 | Iwai |
| 10,297,610 | B2 | 5/2019 | Kai et al. |
| 2012/0051143 | A1 | 3/2012 | Yoon et al. |
| 2017/0287928 | A1 | 10/2017 | Kanamori et al. |
| 2019/0267391 | A1* | 8/2019 | Imai ................. H01L 27/11565 |
| 2020/0006358 | A1* | 1/2020 | Nishikawa ........ H01L 21/76224 |
| 2020/0051995 | A1* | 2/2020 | Tanaka ............... H01L 29/4234 |

\* cited by examiner

*Primary Examiner* — Didarul A Mazumder
*Assistant Examiner* — Gustavo G Ramallo
(74) *Attorney, Agent, or Firm* — Volentine, Whitt & Francos, PLLC

(57) ABSTRACT

A semiconductor device includes; gate layers stacked on a substrate, a channel layer extending through the gate layers, a string select gate layer disposed on the channel layer and a string select channel layer extending through the string select gate layer to contact the channel layer. The string select channel layer includes a first portion below the string select gate layer including a first protruding region, a second portion extending through the string select gate layer, and a third portion above the string select gate layer including a second protruding region.

17 Claims, 39 Drawing Sheets

SEMICONDUCTOR DEVICES WITH STRING SELECT CHANNEL FOR IMPROVED UPPER CONNECTION

CROSS-REFERENCE TO RELATED APPLICATION(S)

This application claims priority to Korean Patent Application No. 10-2019-0145092 filed on Nov. 13, 2019 in the Korean Intellectual Property Office, the subject matter of which is hereby incorporated by reference.

BACKGROUND

The present disclosure relates generally to semiconductor devices.

Contemporary semiconductor devices are increasing required to provide high-speed, advanced data processing capabilities while further reducing their already compact size. Accordingly, it is necessary to continuously increase the integration density of constituent elements and components of semiconductor devices. One technique for increasing the integration density of semiconductor devices is to employ a vertical transistor structure rather than a conventional planar transistor structure.

SUMMARY

Example embodiments provide a semiconductor device having increased integration density and improved electrical characteristics.

According to an example embodiment, a semiconductor device includes semiconductor device including; an alternating arrangement of gate layers and interlayer dielectric layers stacked on a substrate, a channel structure vertically extending through the alternating arrangement of gate layers and interlayer dielectric layers, a string select gate layer disposed on the channel structure, a string select channel layer vertically extending through the string select gate layer to contact the channel structure. The string select channel layer includes a first portion below the string select gate layer, a second portion extending through the string select gate layer, and a third portion above the string select gate layer, and at least one of the first portion and the third portion includes a protruding region.

According to an example embodiment, a semiconductor device includes; gate layers stacked on a substrate, a channel layer extending through the gate layers, a string select gate layer disposed on the channel layer, and a string select channel layer extending through the string select gate layer to contact the channel layer. The string select channel layer includes a first portion below the string select gate layer including a first protruding region, a second portion extending through the string select gate layer, and a third portion above the string select gate layer including a second protruding region.

According to an example embodiment, a semiconductor device includes; gate layers stacked on a substrate, a channel structure including a channel pad and a channel layer and extending through the gate layers, a string select gate layer disposed on the channel structure and including a string select channel layer extending through the string select gate layer to contact the channel pad and the channel layer. The string select channel layer includes a first portion below the string select gate layer including a first protruding region having a first width, a second portion extending through the string select gate layer, and a third portion above the string select gate layer including a second protruding region having a second width greater than the first width.

DETAILED DESCRIPTION

Hereinafter, certain example embodiments will be described with reference to the accompanying drawings. Throughout the written description and drawings, like reference numbers and labels denote like or similar elements.

Figure 1:
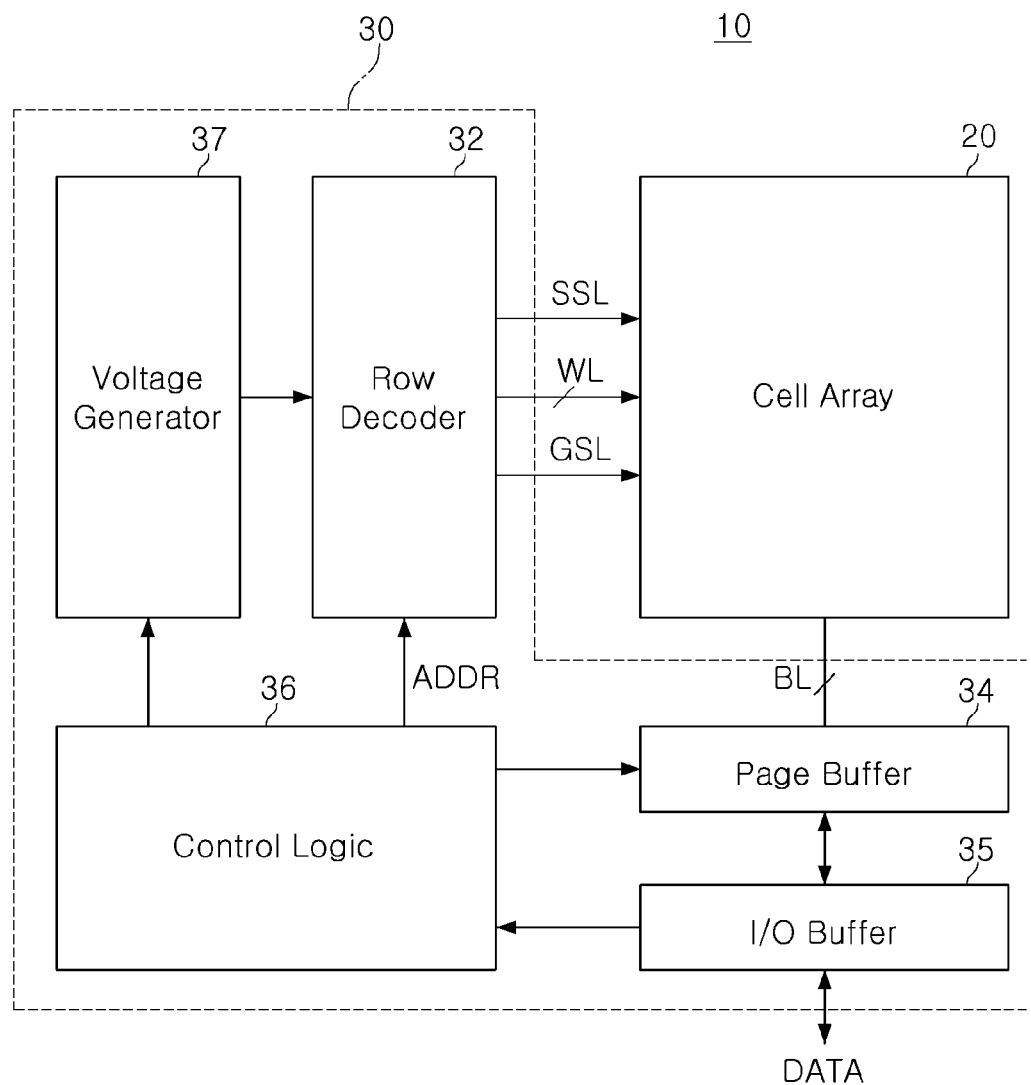
FIG. 1 is a block diagram of a semiconductor device according to example embodiments.

FIG. 1 is a block diagram of a semiconductor device 10 according to example embodiments.

Referring to FIG. 1, the semiconductor device 10 generally includes a memory cell array 20 and a peripheral circuit 30. The peripheral circuit 30 may include a row decoder 32, a page buffer 34, an input/output (I/O) buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, wordlines WL, and a ground select line GSL, and may be connected to the page buffer 34 through bitlines BL. In example embodiments, a plurality of memory cells, arranged along the same row, may be connected to the same wordline WL, and a plurality of memory cells, arranged along the same column, may be connected to the same bitline BL.

The row decoder 32 may decode an input address ADDR to generate and transmit driving signal(s), such as a wordline voltage WL. For example, the row decoder 32 may provide a wordline voltage WL generated by the voltage generator 37 to one or more selected wordline(s) WL from among the plurality of wordlines. Unselected wordlines WL from among the plurality of wordlines may receive another wordline voltage WL under the control of the control logic 36.

The page buffer 34 may be connected to the memory cell array 20 through bitlines BL in order to read (or sense) data stored in memory cells. Alternately or additionally, the page buffer 34 may be used to temporarily store write data to be written (or programmed) in the memory cells, depending on the operating mode of the semiconductor device. The page buffer 34 may include a column decoder and a sense amplifier. The column decoder may selectively activate the bitlines BL of the memory cell array 20, and the sense amplifier may sense a voltage on a bitline BL selected by the column decoder during a read operation to read data stored in a memory cell.

The I/O buffer 35 may receive write data (DATA) during a program operation and transmit the write data to the page buffer 34. The I/O buffer 35 may also output read data (DATA) received from the page buffer 34 to an external entity during a read operation. The I/O buffer 35 may transmit an input address or instruction to the control logic 36.

The control logic 36 may control the overall operation of the row decoder 32 and the page buffer 34. The control logic 36 may receive a control signal and an external voltage transmitted from an external entity, and may operate depending on the received control signal. The control logic 36 may control read, write, and/or erase operations in response to the control signals.

The voltage generator 37 may generate voltages, required for internal operations, such as a program voltage, a read voltage, an erase voltage, and the like, using an external voltage. A voltage generated by the voltage generator 37 may be transferred to the memory cell array 20 through the row decoder 32.

Figure 2:
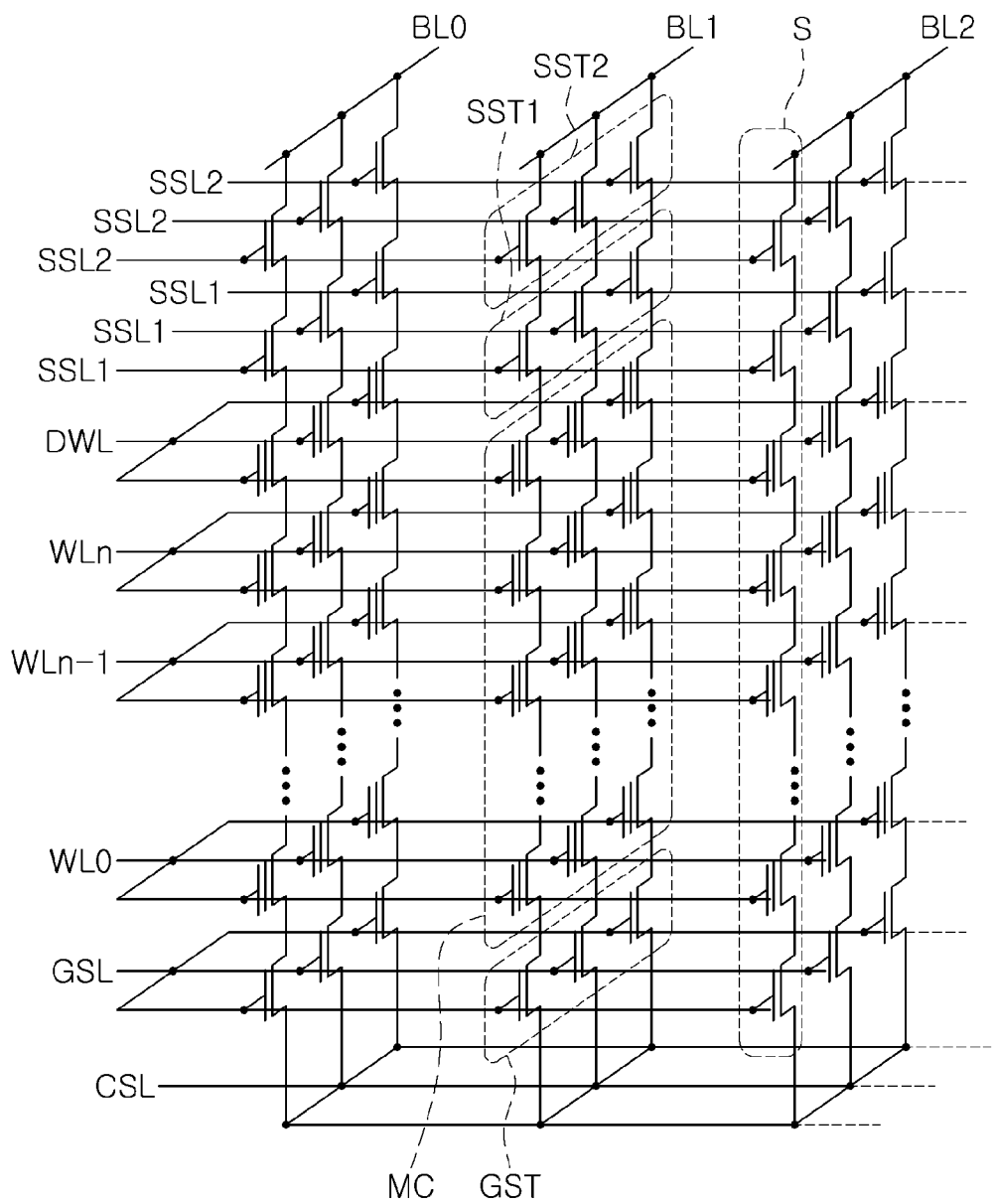
FIG. 2 is an equivalent circuit diagram of a cell array of a semiconductor device according to example embodiments.

FIG. 2 is a partial, equivalent circuit diagram of the memory cell array 20 of FIG. 1 according to example embodiments.

Referring to FIG. 2, the memory cell array 20 includes a plurality of memory cell strings S. The plurality of memory cell strings S may include memory cells MC, connected to each other in series, a ground select transistor GST and string select transistors SST1 and SST2 connected to opposite ends of the memory cells MC in series. The plurality of memory cell strings S may be connected to respective bitlines BL0 to BL2 in parallel. The plurality of memory cell strings S may be commonly connected to a common source line CSL. For example, the plurality of memory cell strings S may be disposed between the plurality of bitlines BL0 to BL2 and the single common source line CSL. In example embodiments, a plurality of common source lines CSL may be two-dimensionally arranged.

Memory cells MC, connected to each other in series, may be controlled by wordlines WL0 to WLn for selecting the memory cells MC. Each of the memory cells MC may include a data storage element. Gate layers of memory cells MC, disposed at substantially the same distance from the common source line CSL, may be commonly connected to one of the wordlines WL0 to WLn to be in an equipotential state. Alternatively, even when the gate layers of the memory cells MC are disposed at substantially the same distance from the common source lines CSL, gate layers disposed in different rows or columns may be independently controlled.

The ground select transistor GST may be controlled by the ground select line GSL and may be connected to the common source line CSL. The string select transistor SST may be controlled by string select lines SSL1 and SSL2 and may be connected to bitlines BL0 to BL2. The equivalent circuit diagram of FIG. 2 illustrates a structure in which one ground select transistor GST and two string select transistors SST1 and SST2 are connected to each of a plurality of memory cells MC connected to each other in series, one string select transistor SST1 or SST2 may be connected thereto or a plurality of ground select transistors GST may be connected thereto. One or more dummy lines DWL or buffer lines may be further disposed between an uppermost wordline WLn, among the wordlines WL0 to WLn, and the string select lines SSL1 and SSL2. In example embodiments, one or more dummy lines DWL may also be disposed between a lowest wordline WL0 and the ground select line GSL.

When signals are applied to the string select transistors SST1 and SST2 through the string select lines SSL1 and SSL2, signals applied through the bitlines BL0 to BL2 may be transmitted to the memory cells MC, connected to each other in series, to read and write data. In addition, a predetermined erase voltage is applied through a substrate to erase data written to the memory cells MC. In example embodiments, the memory cell array 20 may include at least one dummy memory cell string electrically separated from the bitlines BL0 to BL2.

Figure 3:
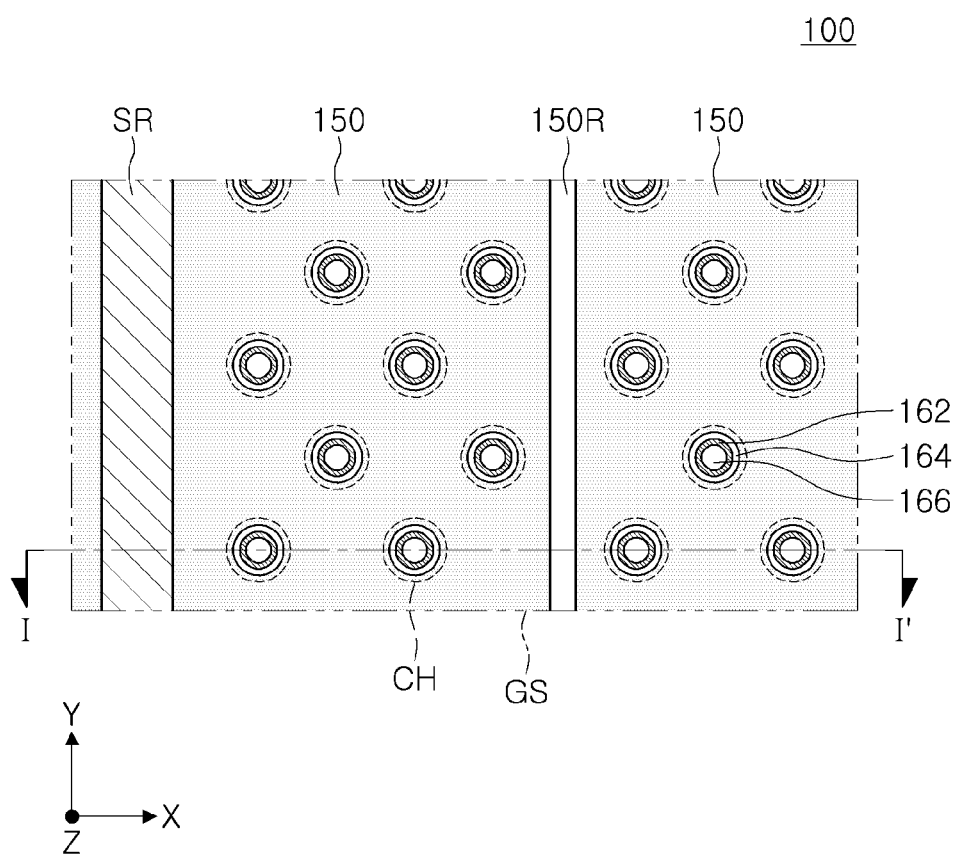
FIG. 3 is a plan view of a semiconductor device according to example embodiments.
Figure 4A:
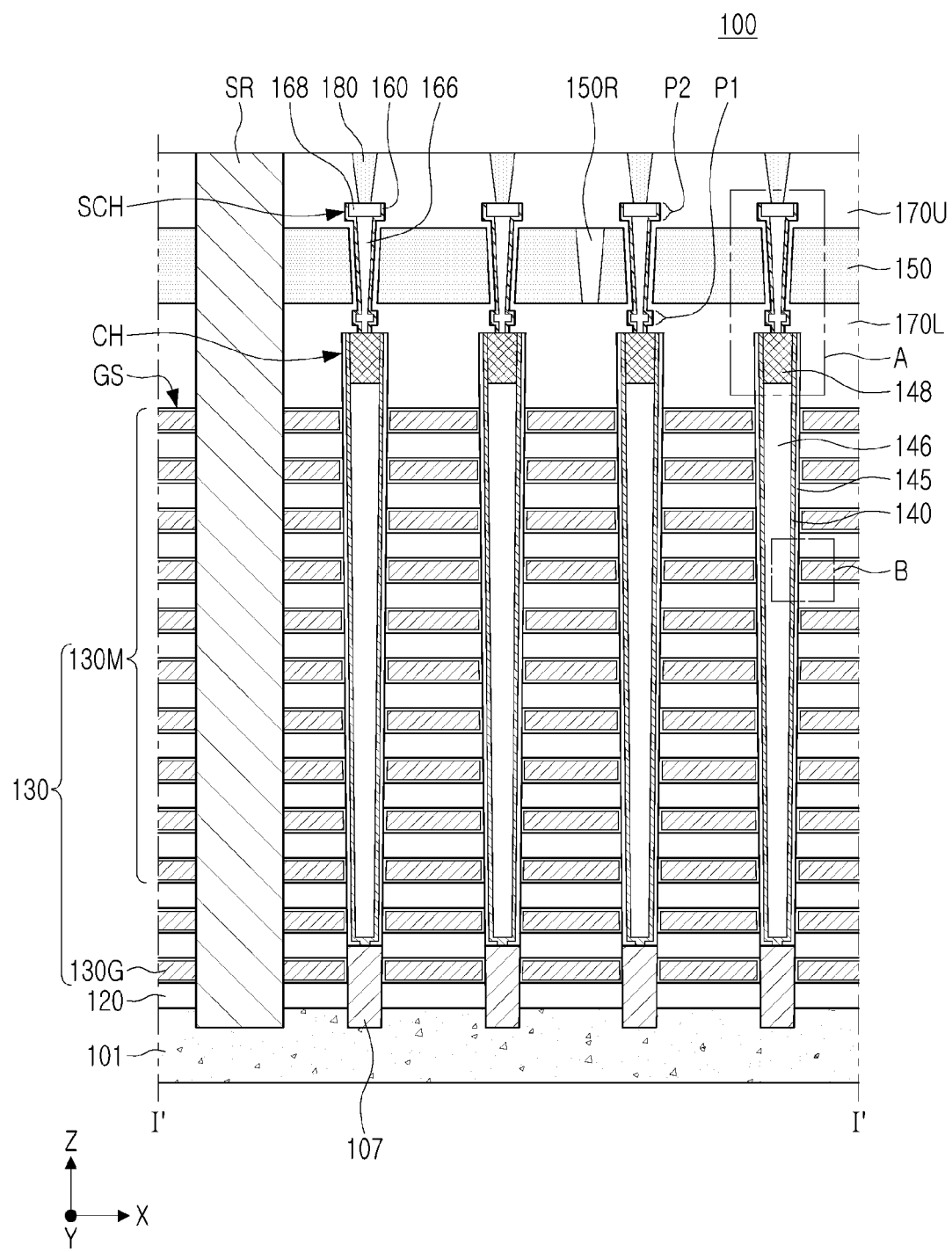
FIG. 4A is a cross-sectional view of a semiconductor device according to example embodiments.
Figure 4B:
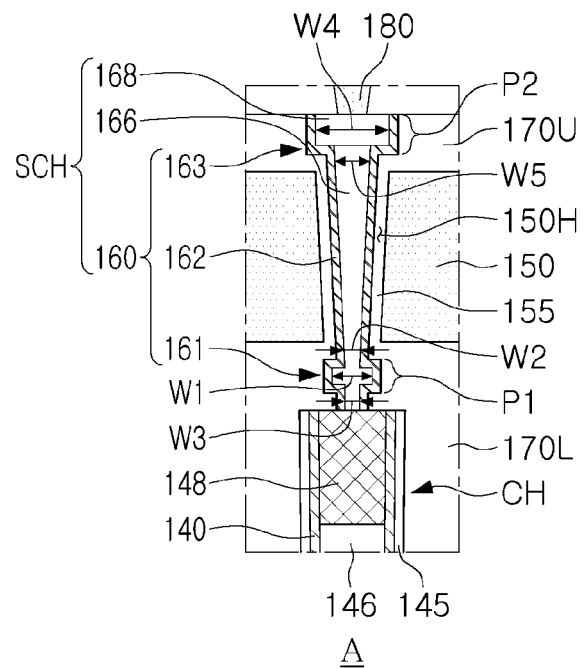
FIGS. 4B and 4C are partially enlarged views of a semiconductor device according to example embodiments.
Figure 4C:
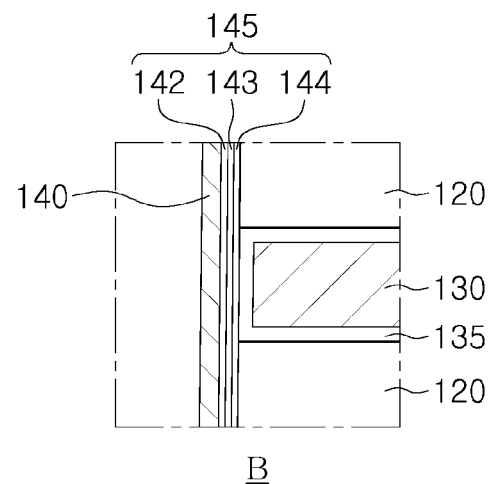

FIG. 3 is a plan view of a semiconductor device 100 according to example embodiments, FIG. 4A is a cross-sectional view taken along line I-I' in FIG. 3, FIG. 4B is a partial, enlarged view of region 'A' in FIG. 4A, and FIG. 4C is a partial, enlarged view of region 'B' in FIG. 4A.

Referring collectively to FIGS. 3, 4A, 4B and 4C, the semiconductor device 100 may include a substrate 101, gate layers 130 vertically stacked on the substrate 101 to be spaced apart from each other, interlayer dielectric layers 120 stacked alternately with the gate layers 130, channel structures CH extending through the gate layers 130 in a direction, perpendicular to an upper surface of the substrate 101, and including a channel layer 140 disposed therein, string select gate layers 150 on the channel structures CH, string select channel layers 160 extending through the string select gate layers 150 in a direction, perpendicular to the upper surface of the substrate 101, and including string select channel structures SCH disposed therein, and separation regions SR extending through a stacked structure GS of the interlayer dielectric layers 120 and the gate layers 130. The semiconductor device 100 may further include a gate blocking layer 135 surrounding at least a portion of the gate layers 130, a string select gate insulating layer 155 surrounding the string select channel structures SCH, an insulating layer 170 on the gate layers 130, a stud 180 on the string select channel structures SCH, and a source conductive layer and a source insulating layer disposed in the separation regions SR.

In the semiconductor device 100, a single memory cell string may be formed around each of channel layers 140, and a plurality of memory cell strings may be arranged in rows and columns in a first direction (e.g., an X direction) and a second direction (e.g., a Y direction).

In this regard, and as illustrated in FIGS. 3 and 4A for example, a geometric orientation may be assumed in the description and/or illustration of example embodiments. Namely, the first (X) direction and the second ('Y') direction may be assumed to describe a horizontal plane relative to an upper surface of substrate 101, whereas a third ('Z') direction may be assumed to describe a vertical direction relative to the horizontal plane. Those skilled in the art will recognize that such geometric orientation is arbitrary and descriptive in nature, and is used to more clearly teach the making and use of example embodiments. Further in this regard, certain relative orientation terms (e.g., up/down; above/ below, underlying/overlying, higher/lower, height, depth, etc.) may be used to describe certain relative relationships between elements and components.

Thus, the substrate 101 may have an upper surface extending in a horizontal plane (e.g., a plane in the X/Y direction). The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The gate layers 130 may be vertically stacked on the substrate 101 to be spaced apart from each other to form a stacked structure GS together with the interlayer dielectric layers 120. The gate layers 130 may include a lower gate layer 130G, constituting a gate of a ground select transistor, and memory gate layers 130M constituting a plurality of memory cells. The number of memory gate layers 130M, constituting memory cells, may be determined depending on capacity of the semiconductor device 100. In example embodiments, one or more lower gate layers 130G, constituting a ground select transistor, may be provided, and may have the same or different structure as or from the gate layers 130 constituting memory cells. A portion of the gate layers 130, for example, memory gate layers 130M, adjacent to the lower gate layer 130G, may be dummy gate layers.

The gate layers 130 may be vertically spaced apart from each other on the substrate 101, and may be separated from each other in the X direction by separation regions SR extending in the Y direction. The gate layers 130 between a pair of separation regions SR may constitute a memory block, but a range of the memory block is not limited thereto. A portion of the gate layers 130, for example, the memory gate layers 130M may constitute a single layer in a single memory block.

The gate layers 130 may include a metal material, for example, tungsten (W). In example embodiments, the gate layers 130 may include polycrystalline silicon or a metal silicide material. In example embodiments, the gate layers 130 may further include a diffusion barrier on an external side thereof. For example, the diffusion barrier may include tungsten nitride (WN), tantalum nitride (TaN), titanium nitride (TiN), or combinations thereof.

The interlayer dielectric layers 120 may be disposed between the gate layers 130. Similarly to the gate layers 130, the interlayer dielectric layers 120 may be disposed to be spaced apart from each other in a direction, perpendicular to the top surface of the substrate 101. The interlayer dielectric layers 120 may include an insulating material such as a silicon oxide or a silicon nitride. The interlayer dielectric layers 120 may have substantially planar upper and lower surfaces. Side surfaces of the interlayer dielectric layers 120 may be coplanar with side surfaces of the gate layers 130 in the separation region SR, and may have a structure protruding toward the separation region SR from the side surfaces of the gate layers 130.

The channel structures CH may each constitute a single memory cell string, and may be disposed on the substrate 101 in rows and columns to be spaced apart from each other. The channel structures CH may be disposed in a lattice form or in a zigzag pattern in one direction. The channel structures CH may have a pillar shape, and may have an inclined side surface in such a manner that a (horizontal) width thereof is decreased in a direction toward the substrate 101 depending on an aspect ratio. The channel structures CH may include a gate dielectric layer 145, a channel insulating layer 146, a channel pad 148, and an epitaxial layer 107 other than the channel layer 140.

The channel layer 140 may be annularly formed to surround the channel insulating layer 146 therein. In some embodiments, the channel layer 140 may have a pillar shape such as a cylindrical or a prismatic shape without the channel insulating layer 146 therein. The channel layer 140 may be connected to an epitaxial layer 107 provided therebelow. The channel layer 140 may include a semiconductor material such as polycrystalline silicon or single-crystalline silicon, and the semiconductor material may be an undoped material or a material including P-type or N-type impurities. The channel structures CH, disposed in a straight line in the X direction, may be connected to different bitlines according to an arrangement of upper interconnection structures connected to the channel pads 148. A portion of the channel structures CH may be dummy channels, not connected to the bitline.

The gate dielectric layer 145 may be disposed between the gate layers 130 and the channel layer 140. Referring to FIG. 4C, the gate dielectric layer 145 may include a tunneling layer 142, a data storage layer 143, and a blocking layer 144 disposed sequentially from the channel layer 140. Similarly to the channel layer 140, the tunneling layer 142, the data storage layer 143, and the blocking layer 144 may extend in a direction perpendicular to the upper surface of the substrate 101.

The tunneling layer 142 may tunnel charges to the data storage layer 143 using the F-N tunneling mechanism. The tunneling layer 142 may include, for example, a silicon oxide ($SiO_2$), a silicon nitride ($Si_3N_4$), a silicon oxynitride (SiON), or combinations thereof. The data storage layer 143 may be a charge trapping layer, and may be formed of a silicon nitride. The blocking layer 144 may include a silicon oxide ($SiO_2$), a silicon nitride ($Si_3N_4$), a silicon oxynitride (SiON), a high-k material, or combinations thereof. The high-k dielectric material refers to a dielectric material having a dielectric constant higher than a dielectric material of a silicon oxide ($SiO_2$). The high-k dielectric material may be, for example, an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($LaHf_xO_y$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or combinations thereof.

The epitaxial layer 107 may be disposed on the substrate 101 below the channel structures CH, and may be disposed on a side surface of at least one gate layer 130. The epitaxial layer 107 may be disposed in a recessed region of the substrate 101. An upper surface of the epitaxial layer 107 may have a height greater than a height of an upper surface of a lowermost gate layer 130G and lower than a height of a lower surface of the overlying gate layer 130M, but the heights thereof are not limited thereto. Even when an aspect ratio of the channel structure CH is increased, the channel layer 140 may be stably, electrically connected to the substrate 101 by the epitaxial layer 107 and uniform characteristics of a ground select transistor GST between memory cell strings may be obtained. However, the epitaxial layer 107 may be omitted in some embodiments. In this case, the channel layer 140 may be directly connected to the substrate 101.

The channel pads 148 may be disposed in an upper portion of the channel layer 140 in channel structures CH. The channel pads 148 may be disposed to cover an upper surface of the channel insulating layer 146 and to be electrically connected to the channel layer 140. The channel pads 148 may include, for example, doped polysilicon.

The string select gate layers 150 may be disposed on the channel structures CH. The string select gate layers 150, constituting a string select line, may extend in the Y direction, and may be separated from each other at regular intervals in the X direction by an upper separation region 150R. The number of string select gate layers 150, separated by the upper separation region 150R, is not limited to that shown in the drawing. The string select gate layers 150 may be separated from each other in the X direction by the separation region SR. The string select gate layers 150 may be gate electrodes of string select transistors and may correspond to the string select lines SSL0 to SSL2 in the illustrated embodiment of FIG. 2. In certain embodiments, the upper separation region 150R may be provided in the form of a line or a rectangle extending in the Y direction, but may be disposed in a zigzag pattern in one direction.

The string select gate layers 150 may include a plurality of holes 150H. The plurality of holes 150H may be disposed to overlap the channel structures CH. The arrangement and/or the number of the plurality of holes 150H is not limited to that shown in the drawing. The string select channel structures SCH may be connected to the channel structures CH through the plurality of holes 150H of the string select gate layers 150. Each of the plurality of holes 150H may have a width greater (in the X direction) than a width of each of the string select channel structures SCH in the plurality of holes 150H.

The string select gate layers 150 may include a semiconductor material such as polycrystalline silicon or single-crystalline silicon, and the semiconductor material may be an undoped material or a material including P-type and/or N-type impurities.

The string select gate insulating layer 155 may surround the string select channel layers 160 in the plurality of holes 150H. For example, the string select gate insulating layer 155 may surround a second portion 162 of a string select channel layer 160 to be described later. The string select gate insulating layer 155 may serve as a gate dielectric layer of the string select transistors. For example, the string select gate insulating layer 155 may insulate the string select gate layers 150 and the string select channel layers 160 from each other. The string select gate insulating layer 155 may have a structure connected to an underlying lower insulating layer 170L and an overlying upper insulating layer 170U, and may include the same material as the lower and upper insulating layers 170L and 170U.

The string select channel structures SCH may be disposed on the substrate in rows and columns to be spaced apart from each other, and may be disposed to overlap the channel structures CH. The string select channel structures SCH may be disposed form a grid or disposed in a zigzag pattern in one direction. The string select channel structures SCH may penetrate through the string select gate layers 150 and may extend from the channel structures CH in a direction, perpendicular to the upper surface of the substrate 101. The string select channel structures SCH may have a pillar shape, and may have an inclined side surface in such a manner that a width thereof is decreased in a direction toward the substrate 101, depending on an aspect ratio. The string select channel structures SCH may include string select channel layers 160 extending in a direction perpendicular to upper surface of the substrate 101, a string select insulating layer 166 within the string select channel layers 160, and a string select channel pad 168 having a lower surface and side surface surrounded by the string select channel layers 160 and the string select insulating layer 166.

The string select channel layer 160 may be annularly formed to surround the string select insulating layer 146 therein. In some embodiments, the channel layers 140 may have a pillar shape such as a cylindrical or a prismatic shape without the string select insulating layer 166. The string select channel layers 160 may be connected to the channel structures CH provided therebelow and may be in contact with the channel pad 148, respectively. The string select channel layers 160 may include a semiconductor material such as polycrystalline silicon or single-crystalline silicon, and the semiconductor material may be an undoped material or a material including P-type and/or N-type impurities. In example embodiments, the string select channel layers 160 may include the same material as the channel layer 140.

Each of the string select channel layers 160 may include a first portion 161 below the string select gate layers 150, a second portion 162 extending (or penetrating) through the string select gate layers 150, and a third portion 163 above the string select gate layers 150. As will be described in some additional detail hereafter, at least one of the first portion 161 and the third portion 163 of each string select channel layer 160 may include a variously shaped protruding region. In this context, the term "protruding region" refers to a part (or region) of the first portion 161 and/or a part of the third portion 163 having inner side surfaces that extend outwardly from a center of the string select channel layer 160 as compared with inner side surfaces immediately above and/or below the protruding region. Thus, assuming a vertically oriented channel structure CH and string select channel layer 160, a protruding region will have a greater width (measured in a horizontal direction) between inner side surfaces than portions of the string select channel layer 160 immediately above and/or below the protruding region.

Thus, the first portion 161 may be disposed between a channel structure CH and the string select gate layers 150, and may be in electrical contact with the channel structures CH through the lower insulating layer 170L. The first portion 161 may include a first protruding region P1 that protrudes (or extends) outwardly from a center of the string select channel layer 160 beyond the tapered sidewalls of the first portion 161 above and/or below the first protruding region P1. Thus, the resulting, expanded protruding width of the first protruding region P1 may extend in the X direction to be greater than the width of an upper part of the first portion 161 overlying the first protruding region P1 and/or the width of a lower part of the first portion 161 underlying the first protruding region P1.

For example, referring to the illustrated embodiment of FIG. 4B, a first width W1 of the first protruding region P1 may be greater than at least one of a second width W2 of an upper part of the first portion 161, and a third width W3 of a lower part of the first portion 161. In one embodiment, the first width W1 may be greater than a maximum allowable value of the third width W3. In example embodiments, it will be understood that the first portion 161 may have a plurality of regions having different widths (e.g., widths that vary according to a tapering of the channel structure CH).

The second portion 162 may be disposed in the plurality of holes 150H of the string select gate layers 150 and may be connected to the first portion 161. The second portion 162 may have a width that is less than a width of the plurality of holes 150H. The second portion 162 may be surrounded by the string select gate insulating layer 155 in the plurality of holes 150H.

The third portion 163 may further extend upwardly from the string select gate layers 150 to be disposed in the upper insulating layer 170U and may be connected to the second portion 162. The third portion 163 may include a second protruding region P2 having a width that extends outwardly in the X direction from the center of the string select channel layer 160. Like the first protruding region P1, the second protruding region P2 may be bracketed by an upper (overlaying) part and/or a lower (underlying) part of the third portion 163 with respect to the second protruding region P2.

For example, the third portion 163 may include the second protruding region P2 having a fourth width W4 that is greater than a fifth width W5 for a lower part of the third portion 163 extending between the second protruding region P2 and the second portion 162. In one embodiment, the fourth width W4 may be greater than a maximum allowable value of the fifth width W5.

In one embodiment, each of the first, second, third, fourth and fifth widths W1, W2, W3, W4, and W5 described above may fall within a range of between about 80 nm to about 120 nm. In this regard, each of the first, second, third, fourth and fifth widths W1, W2, W3, W4, and W5 may be a width measured from between inner side surfaces (or sidewalls) of the string select channel layers 160.

The string select insulating layer 166 may be disposed in the string select channel layers 160, and may have a side surface, perpendicular to the upper surface of the substrate 101, or an inclined surface in such a manner that a width thereof is decreased in a direction toward the substrate 101 depending on an aspect ratio. The string select insulating layer 166 may be disposed in the first and second portions 161 and 162, and may have a region extending in a direction parallel to the upper surface of the substrate 101 in the first protruding region P1. The string select insulating layer 166 may be disposed in the third portion 163, and a top surface of the string select insulating layer 166 may be disposed to be lower than the second protruding region P2. The string select insulating layer 166 may include an insulating material such as a silicon oxide or a silicon nitride.

The string select channel pad 168 may be disposed on inner side surfaces of the string select channel layers 160 in the second protruding region P2. The string select channel pad 168 may be surrounded by the string select channel layers 160 and the string select insulating layer 166 at the bottom and side surfaces thereof. In one embodiment, the string select channel pad 168 may have a fourth width W4 greater than the fifth width W5. In example embodiments, the string select channel pad 168 may have a width that is greater than the width of other constituent portions of the string select channel structure SCH. The string select channel pad 168 may be formed of a conductive material (e.g.,) doped polycrystalline silicon.

However, when the overall width of the channel structures CH is decreased to improve the integration density for a semiconductor device, it may become more difficult to form (and connect) certain upper interconnections having a relatively greater width. According to certain embodiments of the inventive concept, the string select channel pad 168, having a width greater than other portions of the string select channel structure SCH, may be disposed in the second protruding region P2, so that upper interconnections, such as the stud 180, may be more stably connected, thereby providing a more reliable connection between channel layer 140 and the string select channel layers 160. In particular, when a thickness of the stud 180 is relatively greater, the stud 180 may form a more stable contact with the channel layer 140 through the string select channel layers 160. As a result, a semiconductor device incorporating the foregoing configuration may exhibit improved electrical characteristics.

The lower insulating layer 170L may be disposed between the gate layers 130 and the string select gate layers 150, and the upper insulating layer 170U may be disposed on the string select gate layers 150. The lower and upper insulating layers 170L and 170U may include an insulating material such as a silicon oxide or a silicon nitride, and may include the same material. In example embodiments, the lower and upper insulating layers 170L and 170U may constitute a structure connected to the string select gate insulating layer 155 and may also constitute a structure connected to the upper separation region 150R.

The stud 180 may be disposed on the string select channel structure SCH and may extend to the upper surface of the substrate 101 through the upper insulating layer 170U in a direction perpendicular to the upper surface of the substrate 101. The stud 180 may have a side surface, perpendicular to the upper surface of the substrate 101, or an inclined side surface in such a manner that a width thereof is reduced in the X direction depending on an aspect ratio. The stud 180 may be disposed in contact with an upper surface of the string select channel pad 168 and may, thus, be connected to the string select channel pad 168. The stud 180 may be disposed by partially recessing an upper portion of the string select channel pad 168, but a determination based on whether the recess is formed and a recess depth may vary according to example embodiments. The stud 180 may include, for example, a metal nitride such as titanium nitride (TiN), tantalum nitride (TaN), or tungsten nitride (WN), and/or a metal material such as aluminum (Al), tungsten (W), or molybdenum (Mo).

Additional embodiments of a semiconductor device according to the inventive concept will be described with reference to FIGS. 4D, 5A, 5B, 5C, 6A, 6B, 6C, 7, 8 and 9.

Figure 4D:
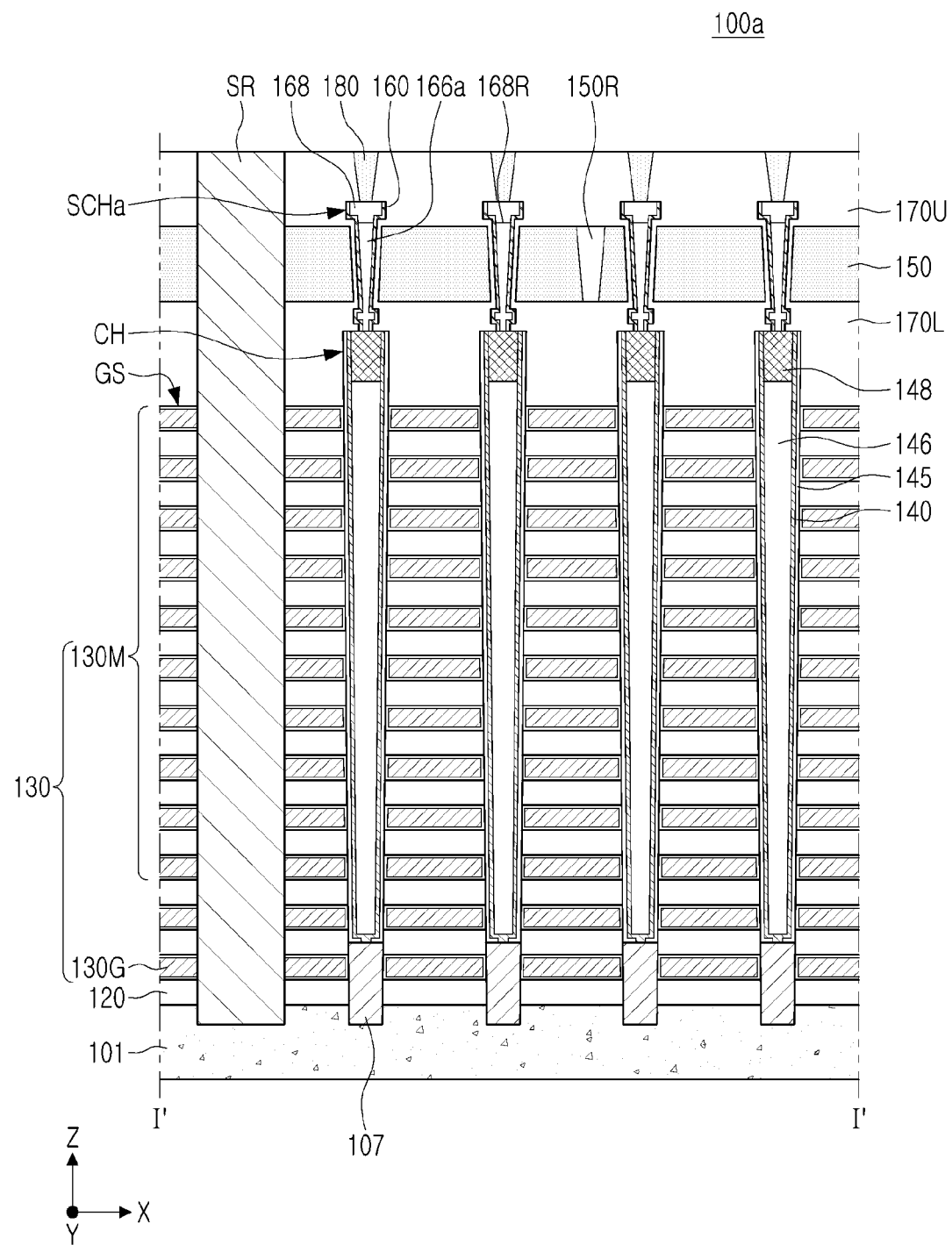
FIG. 4D is a cross-sectional view of a semiconductor device according to example embodiments.

FIG. 4D is a cross-sectional view of a semiconductor device according to example embodiments. FIG. 4D illustrates a region corresponding to a cross section taken along line I-I in FIG. 3.

Referring to FIG. 4D, and by way of comparison with the embodiments described with reference to FIGS. 4A, 4B and 4C, in a semiconductor device 100a, a string select channel pad 168 of string select channel structures SCHa may include an extending portion 168R that extends downwardly from the second protruding region P2. Unlike the above description given with reference to FIG. 4B, a string select insulating layer 166a, filling the inside of a third portion 163, may include a recessed portion, further recessed downwardly than the second protruding region P2. The extending portion 168R may extend downwardly within the recessed portion of the string select insulating layer 166a. This structure may be formed during a process of removing an upper portion of a string select insulating layer 166, filling the inside of the string select channel layers 160, and forming a string select channel pad 168.

Figure 5A:
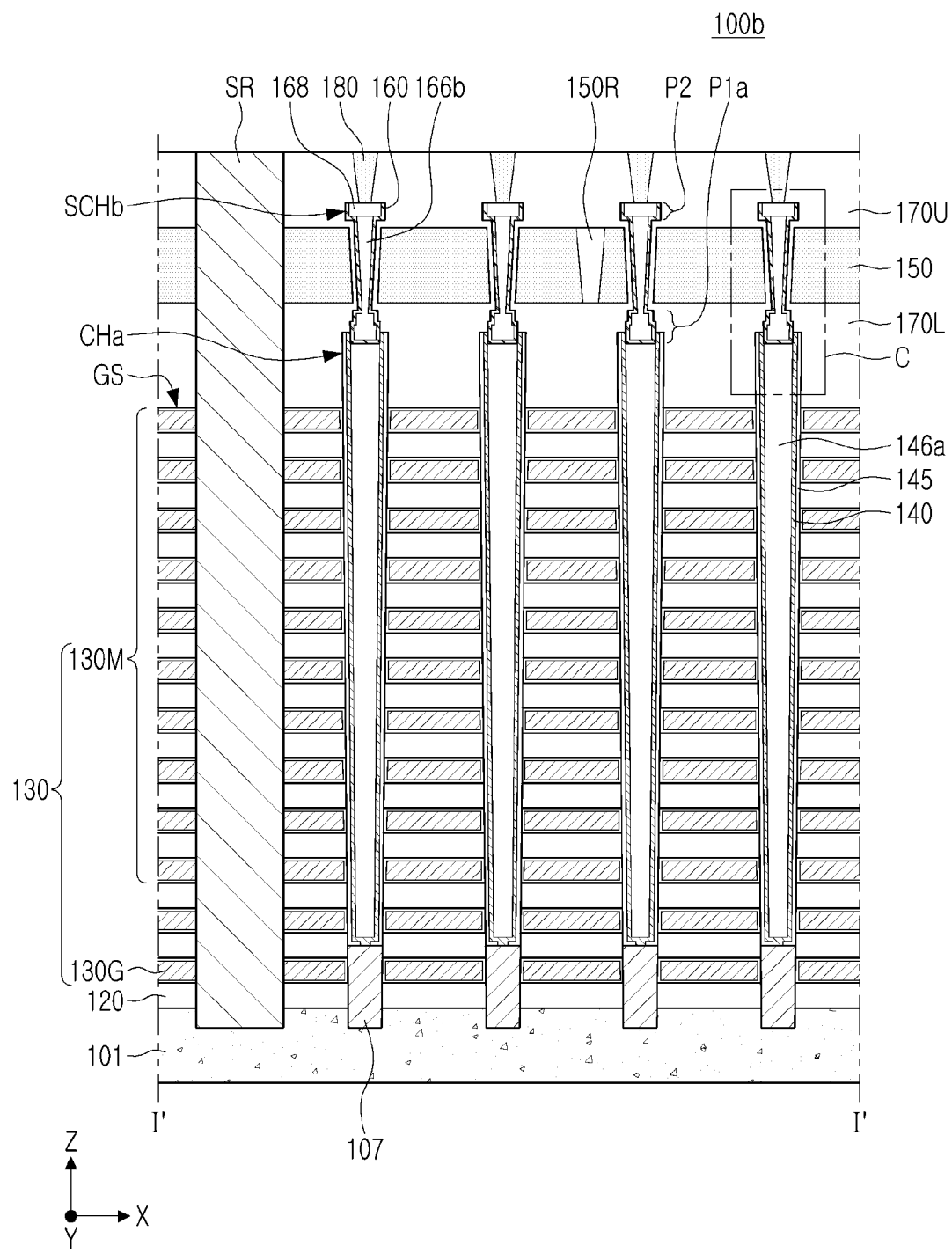
FIG. 5A is a cross-sectional view of a semiconductor device according to example embodiments.
Figure 5B:
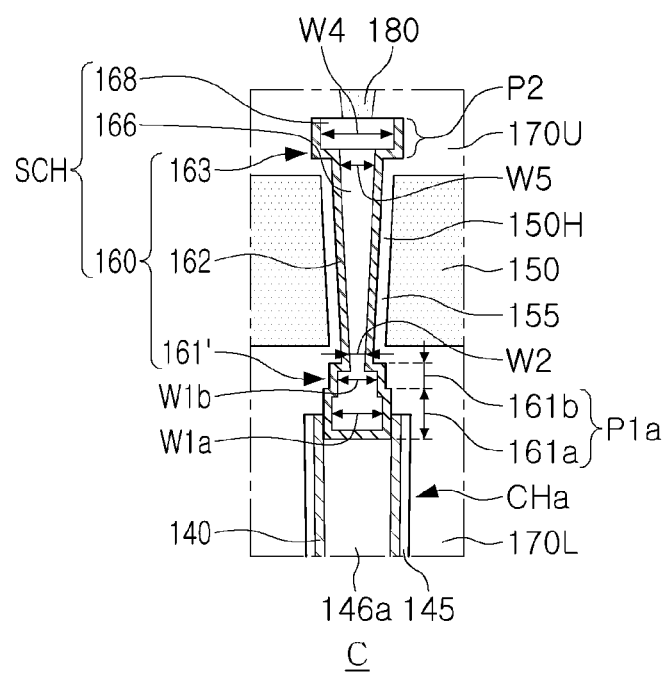
FIG. 5B is a partially enlarged view of a semiconductor device according to example embodiments.

FIG. 5A is a cross-sectional view of a semiconductor device according to example embodiments. FIG. 5A illustrates a region corresponding to a cross section taken along line I-I' in FIG. 3. FIG. 5B is a partially enlarged view of a semiconductor device according to example embodiments. FIG. 5B illustrates an enlarged region of region 'C' in FIG. 5A.

Referring to FIGS. 5A and 5B, by way of comparison with the embodiments described with reference to FIGS. 4A, 4B and 4C, in a semiconductor device 100b, channel structures CHa may include a channel pad on a channel insulating layer 146a, and a lower surface of a first portion 161' of a string select channel layers 160, constituting a string select channel structures SCHb, may be disposed at a "lower' vertical height (given the working geometric assumptions) than upper surfaces of the channel structures CHa.

That is, a lower pedestal part of a pedestal-shaped (hereafter, "pedestal") protruding region P1a may be seated between inner side surfaces of a channel layer 140 to be in direct contact with the inner side surfaces of the channel layer 140. In this context, the term "seated between" refers to a physical disposition between the lower pedestal part of the pedestal region P1a and the upper surface of the channel structure Cha, wherein the lower pedestal part of the pedestal region P1a is disposed lower than the upper surface of the channel structure Cha and between (and in contact with) the inner side surfaces of the channel layer 140.

Hence, the first portion 161' may include a lower pedestal part 161a seated (in the X direction) between the inner side surfaces of the channel structures CHa, and an upper pedestal part 161b disposed on the first pedestal region 161a. The lower pedestal part 161' may serve as a direct point of contact with the channel layer 140 through at least the lower pedestal part 161a. Here, the lower pedestal part 161a may have a first region width W1a, and the upper pedestal part 161b may have a second region width W1b less than the first region width W1a. A second width W2 of the upper part of the first portion 161' may be less than the second region width W1b between the pedestal protruding region P1a and the second portion 162.

When the width of the channel structures CHa is reduced to increase integration density of a semiconductor device, it may be difficult to form a channel pad which completely fills the inside thereof without a gap, thereby degrading the electrical performance of the semiconductor device. However, according to certain embodiments of the inventive concept, instead of forming a channel pad of the channel structures CHa, a portion of the string select channel layers 160 may extend downward to the channel layers 140 and serve as a direct contact with the channel layers 140, thereby providing improved electrical characteristics for the semiconductor device.

Figure 5C:
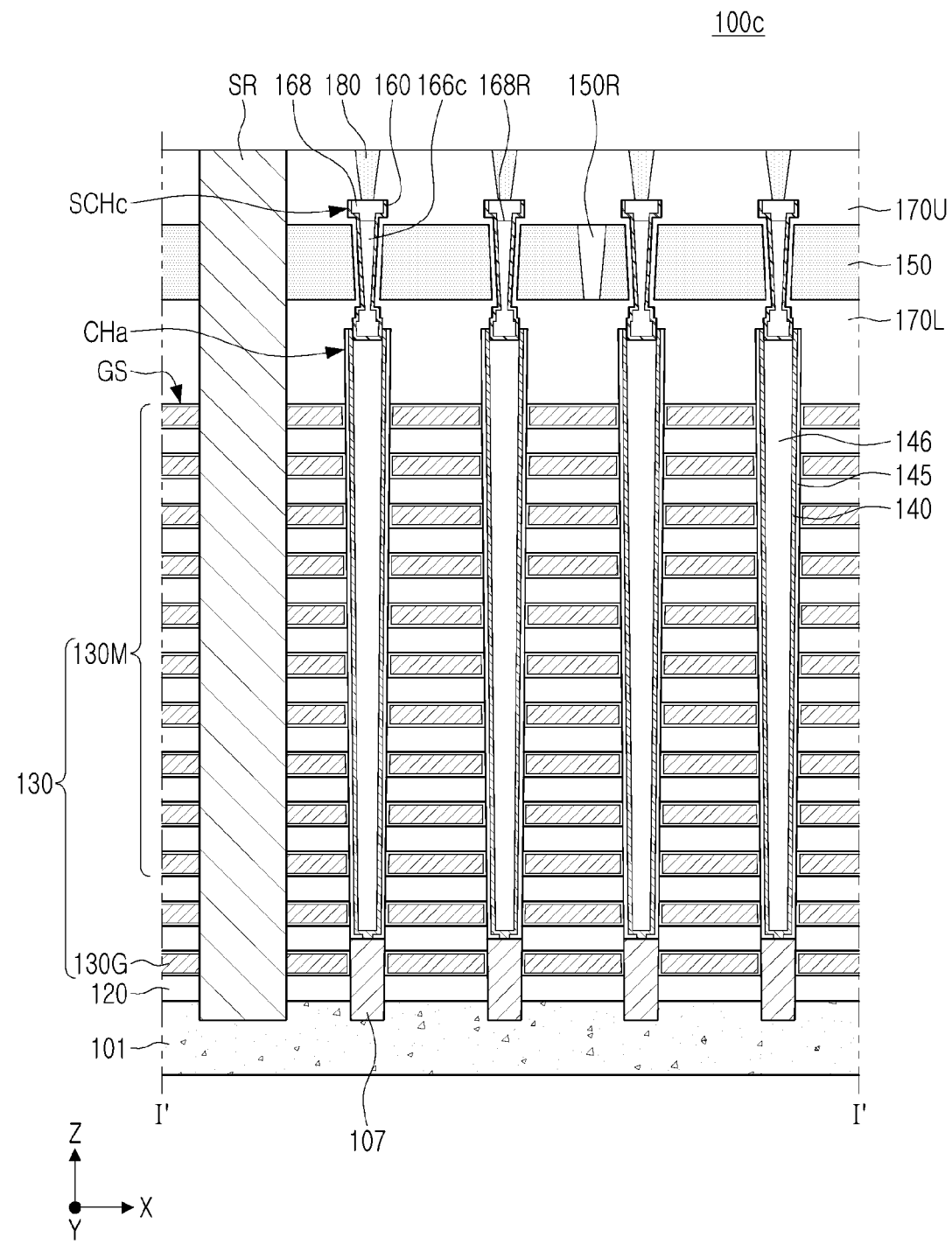
FIG. 5C is a cross-sectional view of a semiconductor device according to example embodiments.

FIG. 5C is a cross-sectional view of a semiconductor device according to example embodiments. FIG. 5C illustrates a region corresponding to a cross section taken along line I-I' in FIG. 3.

Referring to FIG. 5C, in the semiconductor device 100b described with reference to FIGS. 5A and 5B, the string select channel pad 168 of the string select channel structures SCHc further includes an extending portion 168R extending downwardly between the channel structures CHa and the second protruding region P2. Since the extending portion 168R is the same as the extending portion 168R described with reference to FIG. 4D, the description thereof will be omitted.

Figure 6A:
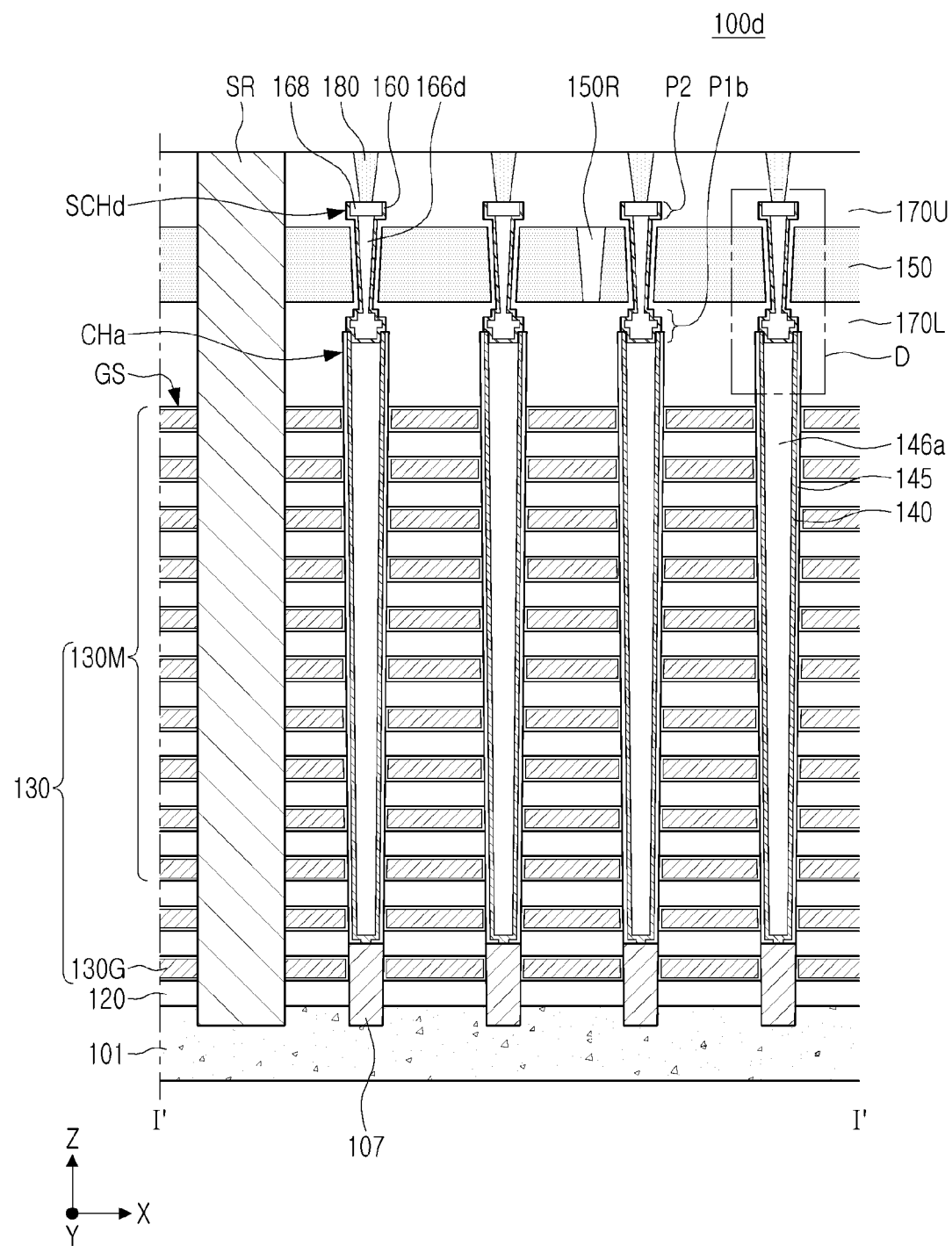
FIG. 6A is a cross-sectional view of a semiconductor device according to example embodiments.

FIG. 6A is a cross-sectional view of a semiconductor device according to example embodiments. FIG. 6A illustrates a region corresponding to the cross section taken along line I-I in FIG. 3.

Figure 6B:
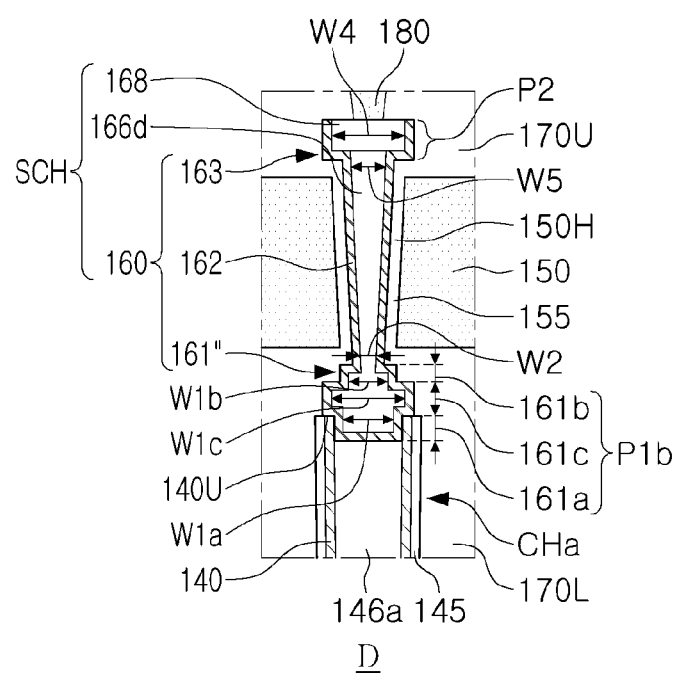
FIG. 6B is a partially enlarged view of a semiconductor device according to example embodiments.

FIG. 6B is a partially enlarged view of a semiconductor device according to example embodiments. FIG. 6B illustrates an enlarged region of region 'D' in FIG. 6A.

Referring to FIGS. 6A and 6B, by way of comparison with the semiconductor device 100d described with reference to FIGS. 4A, 4B and FIG. 4C, channel structures CHa may not include a channel pad on a channel insulating layer 146a, and lower surfaces of the first portions 161" of string select channel layers 160, constituting string select channel structures SCHd, may be disposed to be lower than upper surfaces of the channel structures CHa. A lower part of a plug-shaped (hereafter "plug") protruding region P1b may extend between inner side surfaces of the channel layer 140 to serve as a point of direct contact with the inner side surfaces of the channel layer 140.

In the illustrated embodiment of FIG. 6B, the plug protruding region P1b may include; (1) a lower part 161a seated between (i.e., disposed in contact with and in-filling) the inner side surfaces of the channel layer 140; (2) a middle part 161b disposed on the lower portion 161a and overlapping the upper surfaces of the channel layer 140; and (3) an upper part 161c disposed on the middle portion 161b. Here, the lower part 161a may be in direct contact with the inner side surfaces of the channel layer 140, the middle part 161b may cover the upper surfaces of the channel layer 140, and the upper part 161c may serve as a contact with the second portion 162.

Here, the external side surface of the middle region 161b may protrude outwardly beyond a boundary between the channel layer 140 and the gate dielectric layer 145, but a location thereof is not limited thereto.

The lower part 161a of the plug protruding region P1b may have a first region width W1a, the middle part 161b of the plug protruding region P1b may have a second region width W1c greater than the first region width W1a, and the upper part 161c of the plug protruding region P1b may have a third region width W1b less than the second region width W1c. The third region width W1b may also be less than the second width W2.

As noted above, when a width of each of the channel structures CHa is reduced to increase integration density of a semiconductor device, it may difficult to form a channel pad which completely fills the inside thereof without a gap. However, according to embodiments of the inventive concept, instead of formation of a channel pad on the channel structures CHa, a portion of the string select channel layers 160 may extend between inner side surfaces of the channel layer 140 to be in direct contact with the channel layers 140, and thus, a semiconductor device enjoy improved electrical characteristics.

Figure 6C:
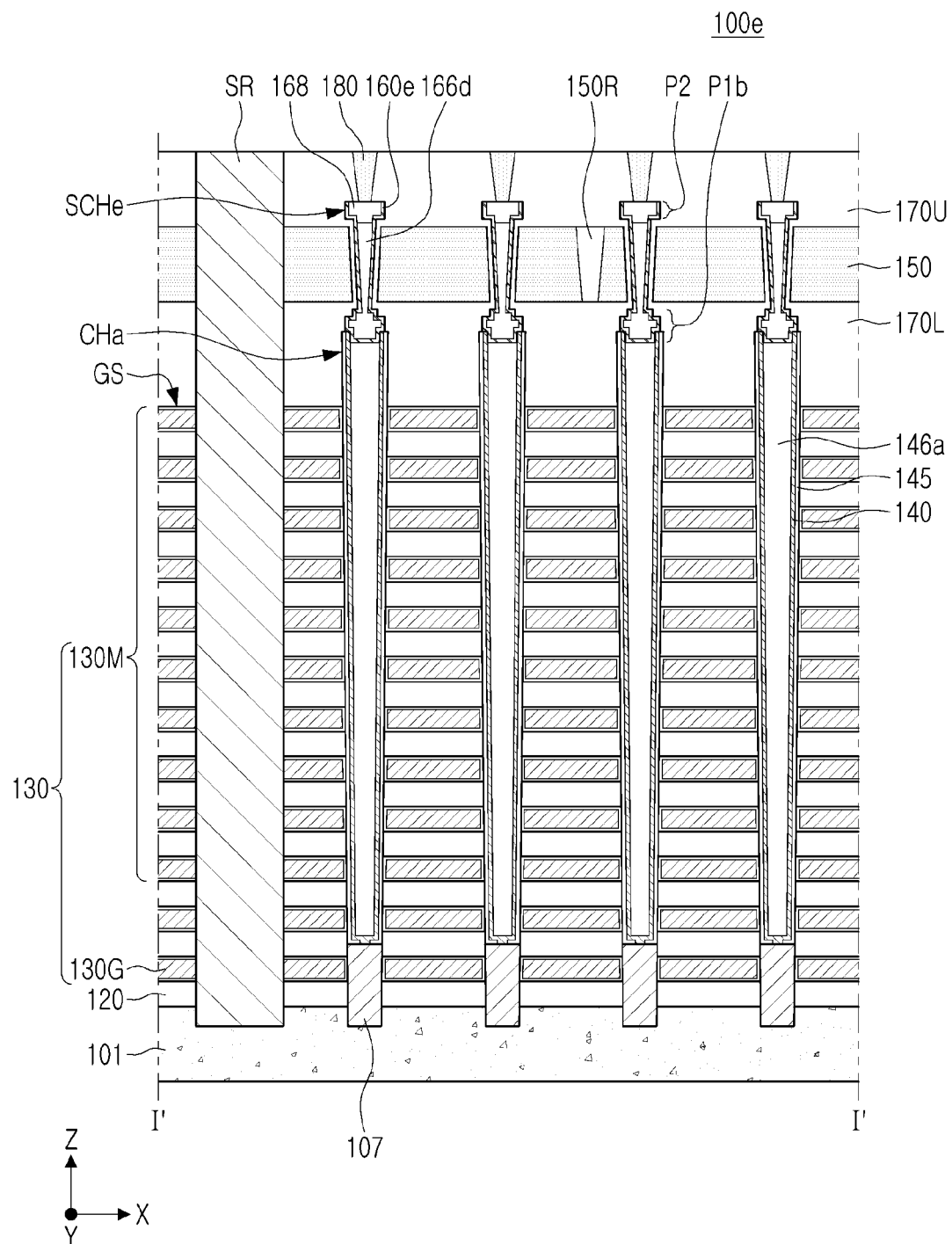
FIG. 6C is a cross-sectional view of a semiconductor device according to example embodiments.

FIG. 6C is a cross-sectional view of a semiconductor device according to example embodiments. FIG. 5C illustrates a region corresponding to a cross section taken along line I-I' in FIG. 3.

Referring to FIG. 6C, a semiconductor device 100e corresponds to an example embodiment in which, in the semiconductor device 100d described with reference to FIGS. 6A and 6B, the string select channel pad 168 may further include an extending portion 168R extending further to the channel structures CHa from a second protruding region P2. Since the extending portion 168R is the same as the extending portion 168R described with reference to FIG. 4D, a description thereof will be omitted.

Figure 7:
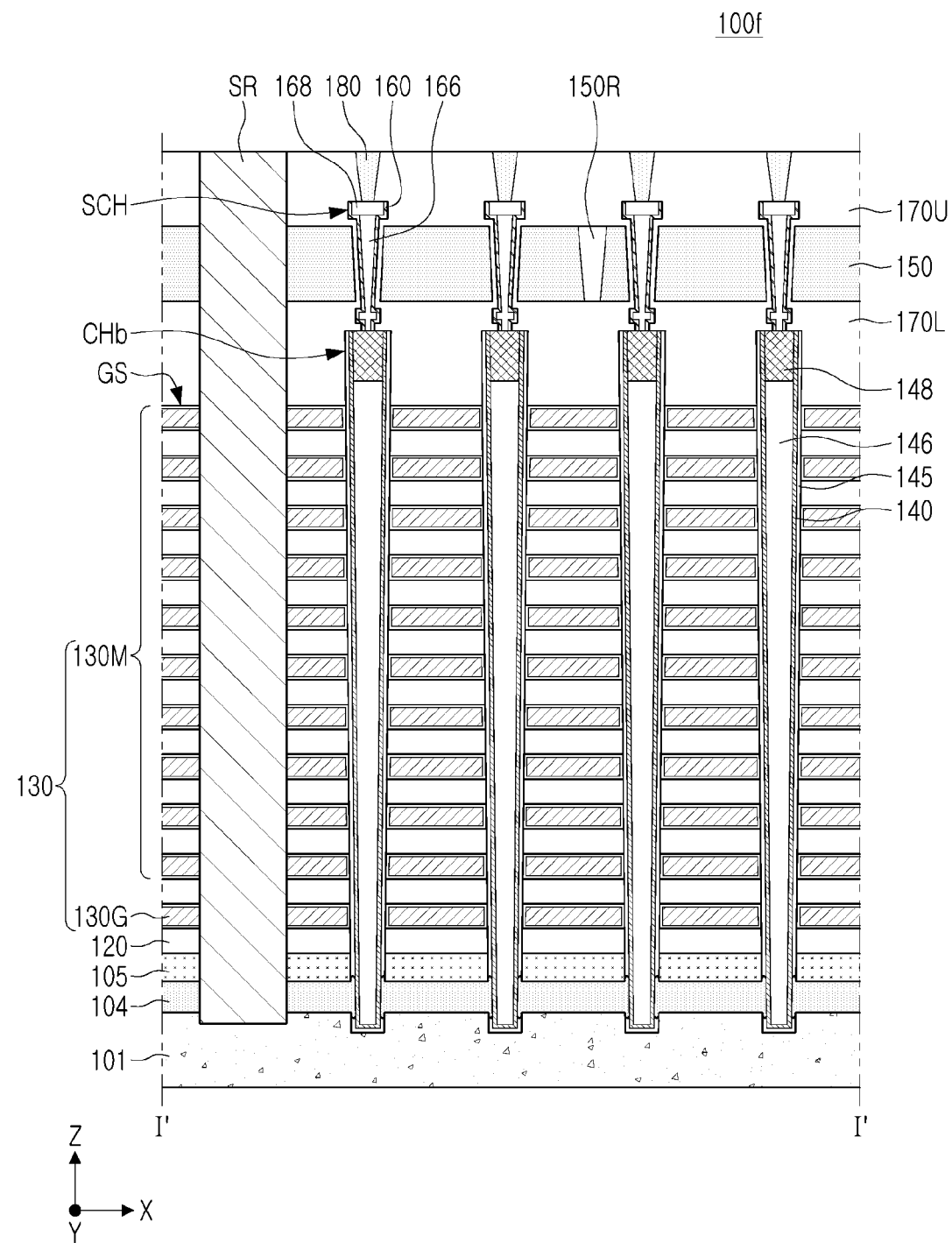
FIGS. 7, 8 and 9 are cross-sectional views of a semiconductor device according to example embodiments.

FIG. 7 is a cross-sectional view of a semiconductor device according to example embodiments. FIG. 7 illustrates a region corresponding to a cross section taken along line I-I' in FIG. 3.

Referring to FIG. 7, by way of comparison with the semiconductor device 100 described with reference to FIG. 4A, a semiconductor device 100f may include channel structures CHb which do not include an epitaxial layer 107 and may further include first and second conductive layers 104 and 105 disposed between a substrate 101 and an interlayer dielectric layer 120. In addition, a separation region SR may be filled with only a separation insulating layer including an insulating material.

First and second conductive layers 104 and 105 may be stacked on the upper surface of the substrate 101. At least a portion of the first and second conductive layers 104 and 105 may function as a common source line of the semiconductor device 100f. The first conductive layer 104 may be directly connected to a channel layer 140 around a channel structures CHb. The first and second conductive layers 104 and 105 may include a semiconductor material, for example, polycrystalline silicon. In this case, at least the first conductive layer 104 may be a doped layer, and the second conductive layer 105 may be a doped layer or a layer including impurities diffused from the first conductive layer 104.

In the channel structures CHb of FIG. 7, the channel layer 140 and a gate dielectric layer 145 may be disposed to extend inwardly into (i.e., deeper than an upper principal surface) the substrate 101. A portion of the gate dielectric layer 145 may be removed from a lower end thereof, and the first conductive layer 104 may be connected to the channel layer 140 in a region in which the gate dielectric layer 145 is removed. As described above, the shape of the common source line, including the first and second conductive layers 104 and 105, may be applied to the example embodiments of FIGS. 4A, 4B, 4C, 5A, 5B, 6A, 6B and 6C.

Figure 8:
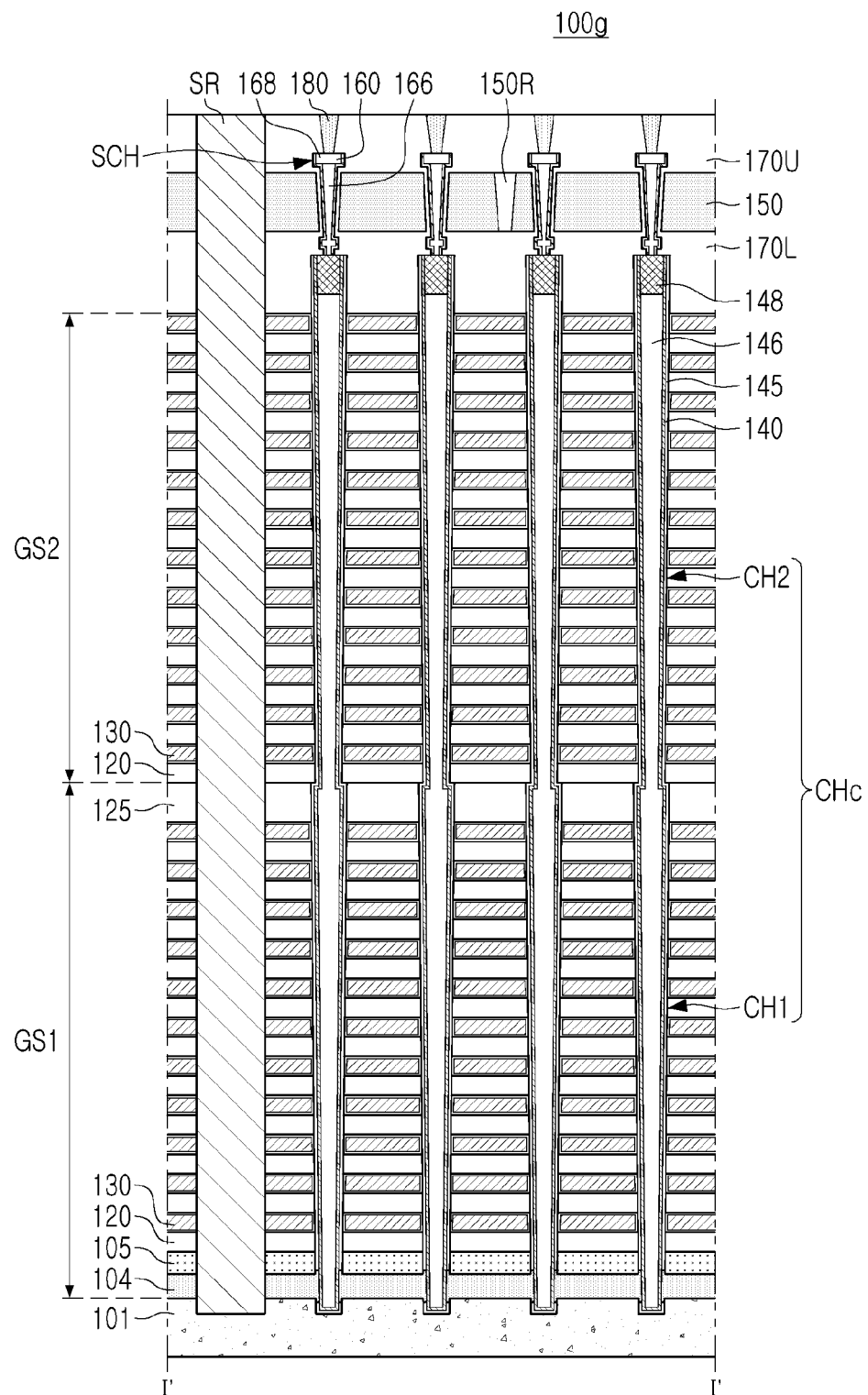

FIG. 8 is a cross-sectional view of a semiconductor device according to example embodiments. FIG. 8 illustrates a region corresponding to a cross section taken along line I-I' in FIG. 3.

Referring to FIG. 8, a semiconductor device 100g may include first and second stacked structures GS1 and GS2, in which gate layers 130 are vertically stacked, and first and second channel structures CH1 and CH2 in which channel structures CHc are vertically stacked. Such a configuration of the channel structures CHc may be introduced to stably form the channel structures CHc when the number of the stacked gate layers 130 is relatively great.

The channel structures CHc may have a pillar shape, and may have an inclined side surface in such a manner that a width thereof decreases in the Z direction toward the substrate 101 depending on an aspect ratio. Thus, widths of the gate layers 130 in the X direction may be different from one another and resistance characteristics of the gate layer 130 may vary accordingly. For example, lower gate layers 130 may have relatively lower resistance(s) and may yield memory cells exhibiting improved performance characteristics. The separation region SR may have an inclined side surface narrowing in the Z direction towards the substrate 101 depending on an aspect ratio. Accordingly, gate layers of the first stacked structures GS1 may have relatively lower resistance and provide memory cells exhibiting improved characteristics.

In the channel structures CHc, the first channel structures CH1 of the first stacked structure GS1 and the second channel structures CH2 of the second stacked structure GS2 may be connected to each other. As a result, the channel structures CHc may include a bent portion formed by a difference in width at a connection portion between the first channel structures CH1 of the first stacked structure GS1 and the second channel structures CH2 of the second stacked structure GS2. The channel layer 140, the gate dielectric layer 145, and the channel insulating layer 146 are in a state of being connected to each other between the first channel structure CH1 and the second channel structure CH2. The channel pad 148 may be disposed at only an upper end of the upper second channel structure CH2. However, in other embodiments, each of the first channel structure CH1 and the second channel structure CH2 may include a channel pad 148. In this case, the channel pad 148 of the first channel structure CH1 may be connected to the channel layer 140 of the second channel structure CH2. As described in the example embodiment of FIG. 8, the semiconductor device 100g may include first and second conductive layers 104 and 105, but is not limited thereto. For example, the semiconductor device 100g may further include an epitaxial layer 107, disposed on a lower end of the channel structures CHb described in the example embodiment of FIG. 4A, rather than the first and second conductive layers 104 and 105.

An upper interlayer dielectric layer 125, having a relatively large thickness, may be disposed on an uppermost portion of the first stacked structure GS1. However, the interlayer dielectric layers 120 and the upper interlayer dielectric layer 125 may have various shapes according to example embodiments. In example embodiments, a dummy gate layer may be further disposed on a boundary between the first stacked structure GS1 and the second stacked structure GS2. The dummy gate layer may not operate as an actual memory cell in which data is stored. The descriptions of the other components may be the same as those given above with reference to FIGS. 3, 4A, 4B and 4C.

Figure 9:
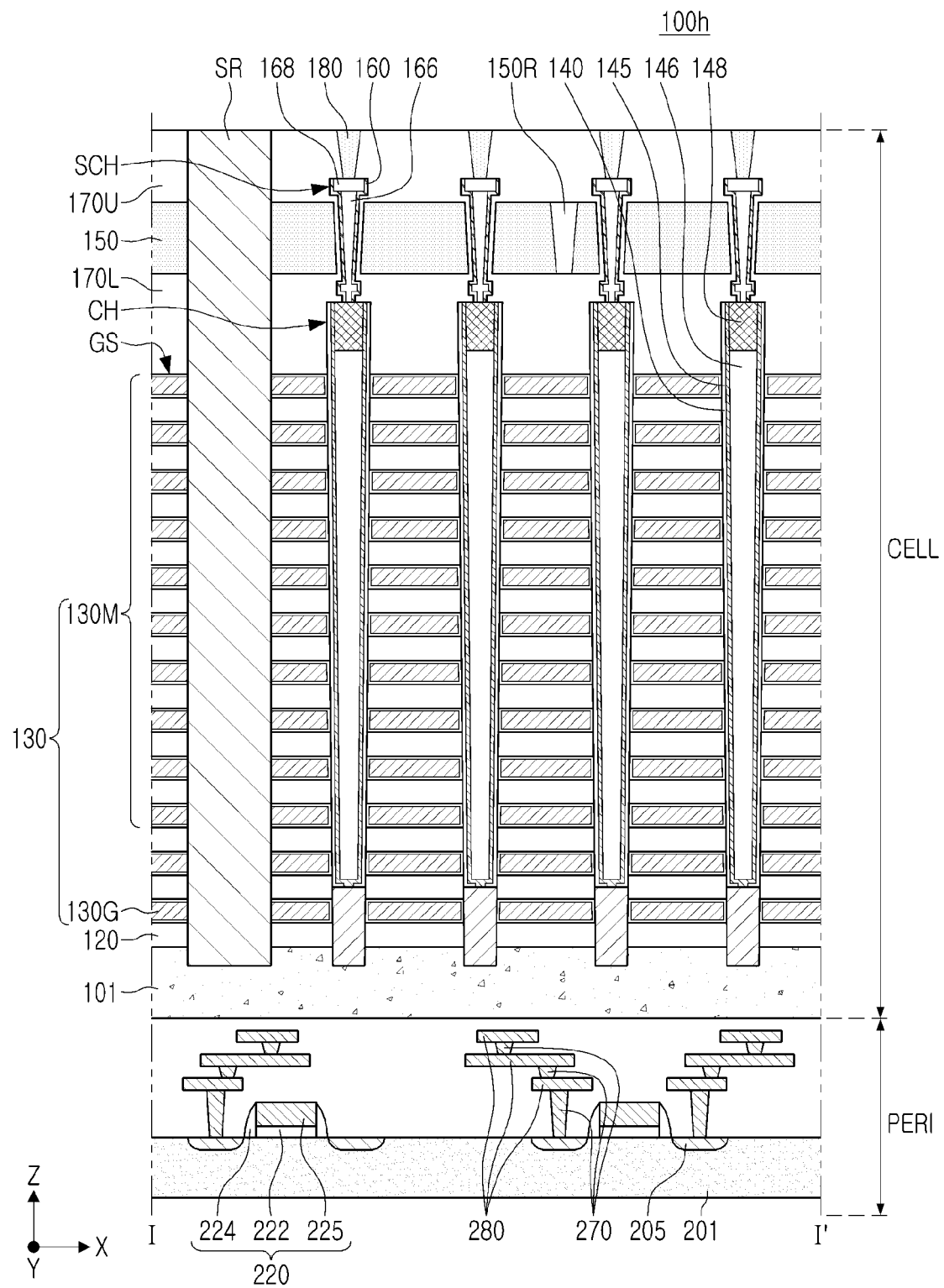

FIG. 9 is a cross-sectional view of a semiconductor device according to example embodiments. FIG. 9 illustrates a region corresponding to a cross section taken along line I-I' in FIG. 3.

Referring to FIG. 9, a semiconductor device 100h may include a memory cell region CELL vertically stacked on a peripheral circuit region PERI. Thus, the memory cell region CELL may be disposed above (or on an upper end of) the peripheral circuit region PERI. By way of comparison, the semiconductor device 100 of FIG. 4A may include a peripheral circuit region PERI disposed on the substrate 101, or as illustrated in FIG. 9, the semiconductor device 100h may include a vertically stacked arrangement of the memory cell region CELL and the peripheral circuit region PERI. In other embodiments, however, the cell region CELL may be disposed below the peripheral circuit region PERI. The descriptions of the other components may be the same as those given above with reference to FIGS. 3, 4A, 4B and 4C.

The peripheral circuit region PERI may include a base substrate 201, circuit elements 220 disposed on the base substrate 201, circuit contact plugs 270, and circuit interconnection lines 280.

The base substrate 201 may have an upper surface extending in a horizontal plane (e.g., in the X-Y directions). In the base substrate 201, additional device isolation layers may be formed to define active regions. Source/drain regions 205, including impurities, may be disposed in portions of the active regions. The base substrate 201 may include a semiconductor material, such as a group IV semiconductor, a group III-V compound semiconductor, or a group II-VI compound semiconductor.

The circuit elements 220 may include a horizontal transistor. Each of the circuit elements 220 may include a circuit gate dielectric layer 222, a spacer layer 224, and a circuit gate electrode 225. The source/drain regions 205 may be disposed in the base substrate 201 on opposite sides adjacent to the circuit gate electrode 225.

A peripheral region insulating layer 290 may be disposed on the circuit element 220 on the base substrate 201. Circuit contact plugs 270 may be connected to the source/drain regions 205 through the peripheral region insulating layer

290. Electrical signals may be applied to the circuit element 220 by the circuit contact plugs 270. In a region, not illustrated, the circuit contact plugs 270 may also be connected to the circuit gate electrode 225. Circuit interconnection lines 280 may be connected to the circuit contact plugs 270 and may be disposed as a plurality of layers.

In the semiconductor device 100*h*, the peripheral circuit region PERI may be formed, and then the substrate 101 of the memory cell region CELL may be formed thereon. The substrate 101 may be formed to have the same size as the base substrate 201 or a smaller size than the base substrate 201. Those skilled in the art will recognize that the memory cell region CELL and the peripheral circuit region PERI may be interconnected with one another using a variety of vertical and horizontal connections (not shown). For example, one end of the gate layers 130 in the Y direction may be electrically connected to the circuit elements 220. The foregoing configuration, in which the memory cell region CELL and the peripheral circuit region PERI are vertically stacked, may be applied to the any one of example embodiments of FIGS. 4A, 4B, 4C, 5A, 5B, 6A, 6B, 6C, 7 and 8.

FIGS. 10A to 10L are cross-sectional views illustrating in one example a method of fabricating a semiconductor device according to example embodiments.

Figure 10A:
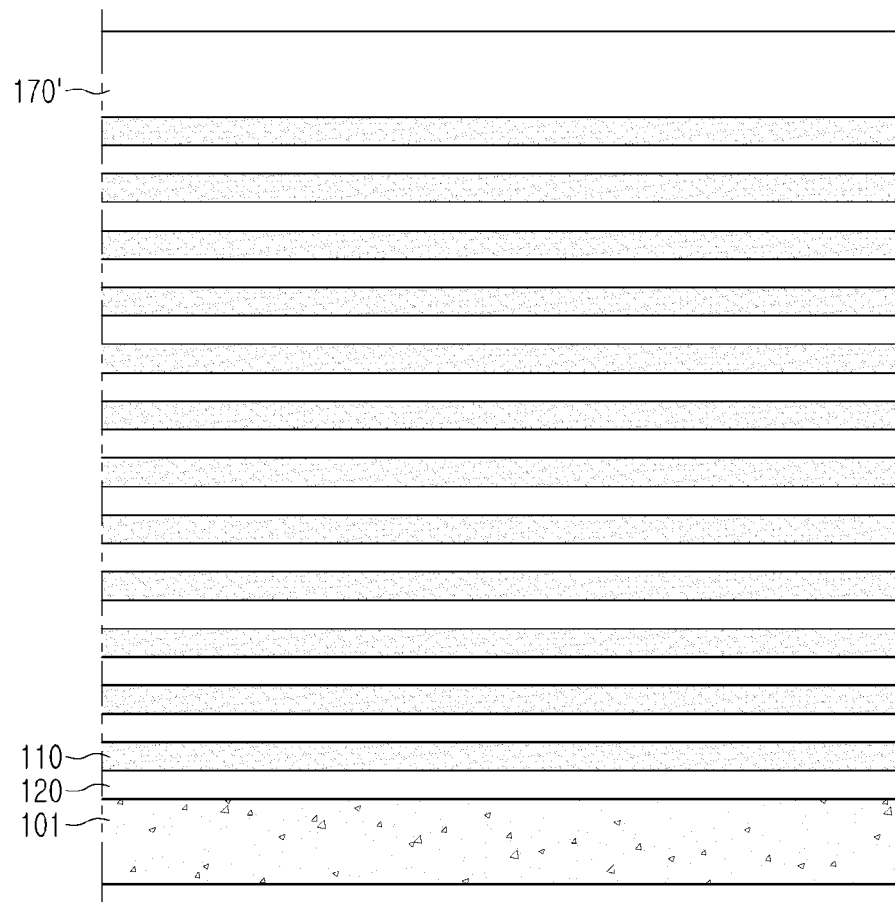
FIGS. 10A through 10L, inclusive, are related cross-sectional views illustrating a method of fabricating a semiconductor device according to example embodiments.

Referring to FIG. 10A, horizontal sacrificial layers 110 and interlayer dielectric layers 120 may be alternately stacked on a substrate 101 to form a stacked structure.

The horizontal sacrificial layers 110 may be replaced with the gate layers 130 through a subsequent process. The horizontal sacrificial layers 110 may be formed of a material different from a material of the interlayer dielectric layers 120. For example, the interlayer dielectric layer 120 may be formed of at least one of a silicon oxide and a silicon nitride, and the horizontal sacrificial layers 110 may be formed of a material, selected from silicon, silicon oxide, silicon carbide, and silicon nitride, different from the material of the interlayer dielectric layer 120. In example embodiments, thicknesses of the interlayer dielectric layers 120 may not all be the same. For example, a lowermost interlayer dielectric layer 120 may be formed to have a relatively small thickness, and an uppermost interlayer dielectric layer 120 may be formed to have a relatively large thick. The thicknesses of the interlayer dielectric layers 120 and the horizontal sacrificial layers 110 and the number of constituent layers may vary from those illustrated in the drawing. A preliminary insulating layer 170' may be formed on an uppermost portion.

Figure 10B:
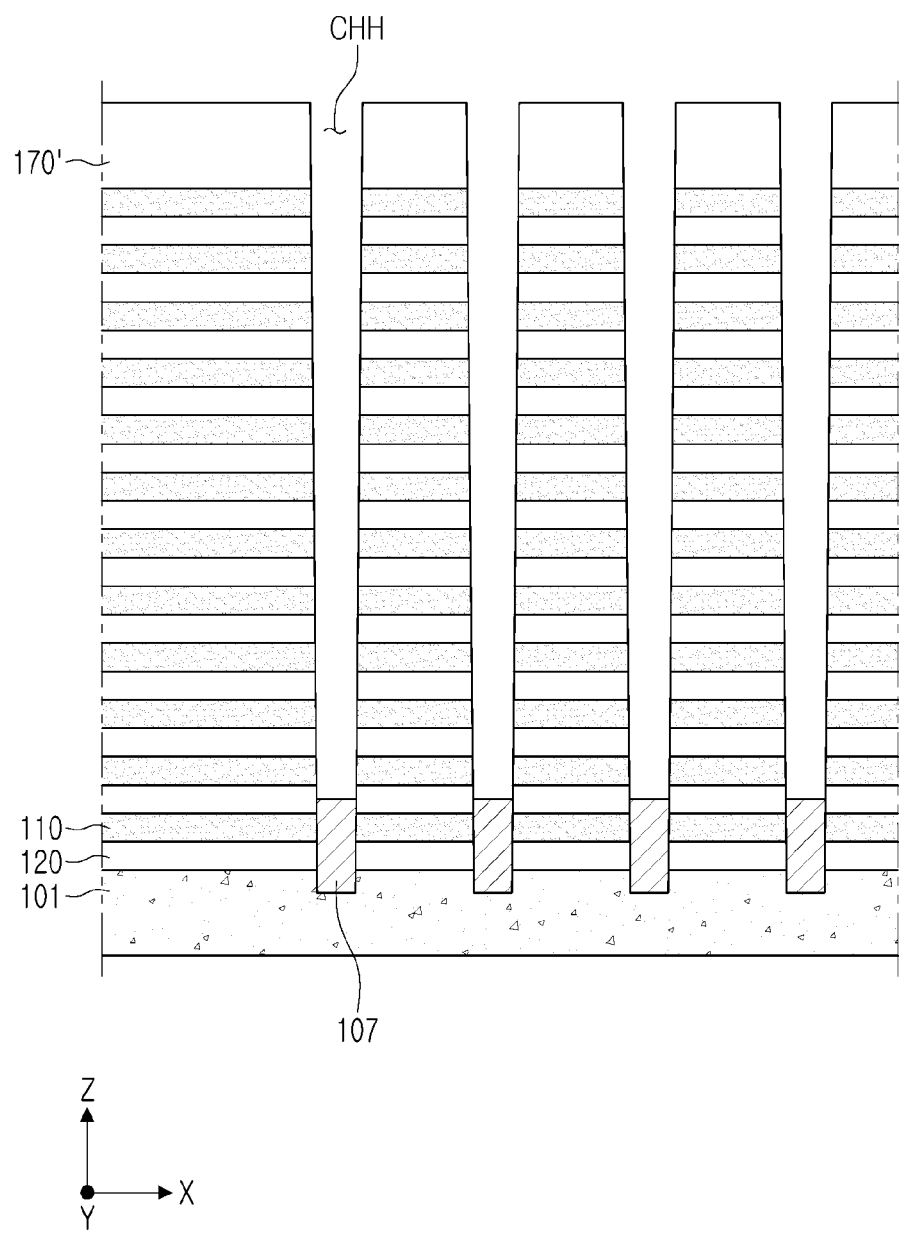

Referring to FIG. 10B, channel holes CHH may be formed through the stacked structure including the horizontal sacrificial layers 110 and the interlayer dielectric layers 120, and an epitaxial layers 107 may be formed on a lower end thereof.

The channel holes CHH may be formed by anisotropically etching the horizontal sacrificial layers 110 and the interlayer dielectric layers 120, and may be formed to have a circular hole shape. Due to a height of the stacked structure, sidewalls of the channel holes CHH may not be perpendicular to an upper surface of the substrate 101. The channel holes CHH may be formed to recess a portion of the substrate 101.

Epitaxial layers 107 may be formed using a selective epitaxial growth (SEG). The epitaxial layers 107 may include a single layer or a plurality of layers. The epitaxial layers 107 may include doped or undoped polycrystalline silicon, single-crystalline silicon, polycrystalline germanium, or single-crystalline germanium. However, in example embodiments, the epitaxial layers 107 may be omitted.

Figure 10C:
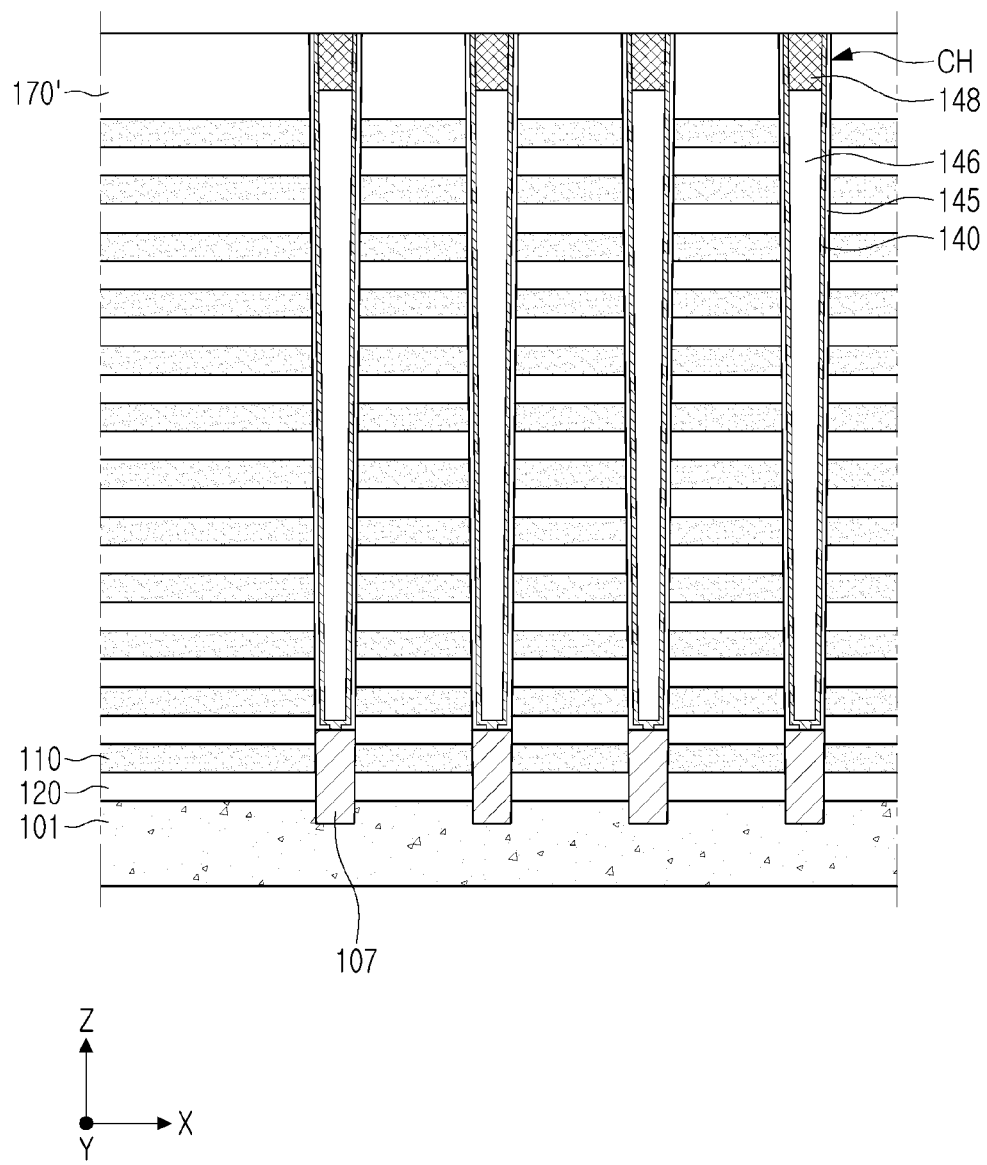

Referring to FIG. 10C, a gate dielectric layer 145, a channel layer 140, a channel insulating layer 146, and a channel pad 148 may be sequentially formed in the channel holes CHH to form channel structures CH.

The gate dielectric layer 145 may be formed using atomic layer deposition (ALD) or chemical vapor deposition (CVD) to have a uniform thickness. At this point, all or a portion of the gate dielectric layer 145 may be formed and portions, extending along the channel structures CH in a direction perpendicular to the upper surface of the substrate 101, for example, the tunneling layer 142, the data storage layer 143, and the blocking layer 144 in FIG. 4A may be formed.

The channel layer 140 may be formed on the gate dielectric layer 145 in the channel holes. The channel insulating layer 146 is formed to fill the channel holes, and may include an insulating material. However, in example embodiments, the channel holes may be filled with a conductive material, rather than the channel insulating layer 146. The channel pad 148 may be formed of a conductive material, for example, polycrystalline silicon.

Figure 10D:
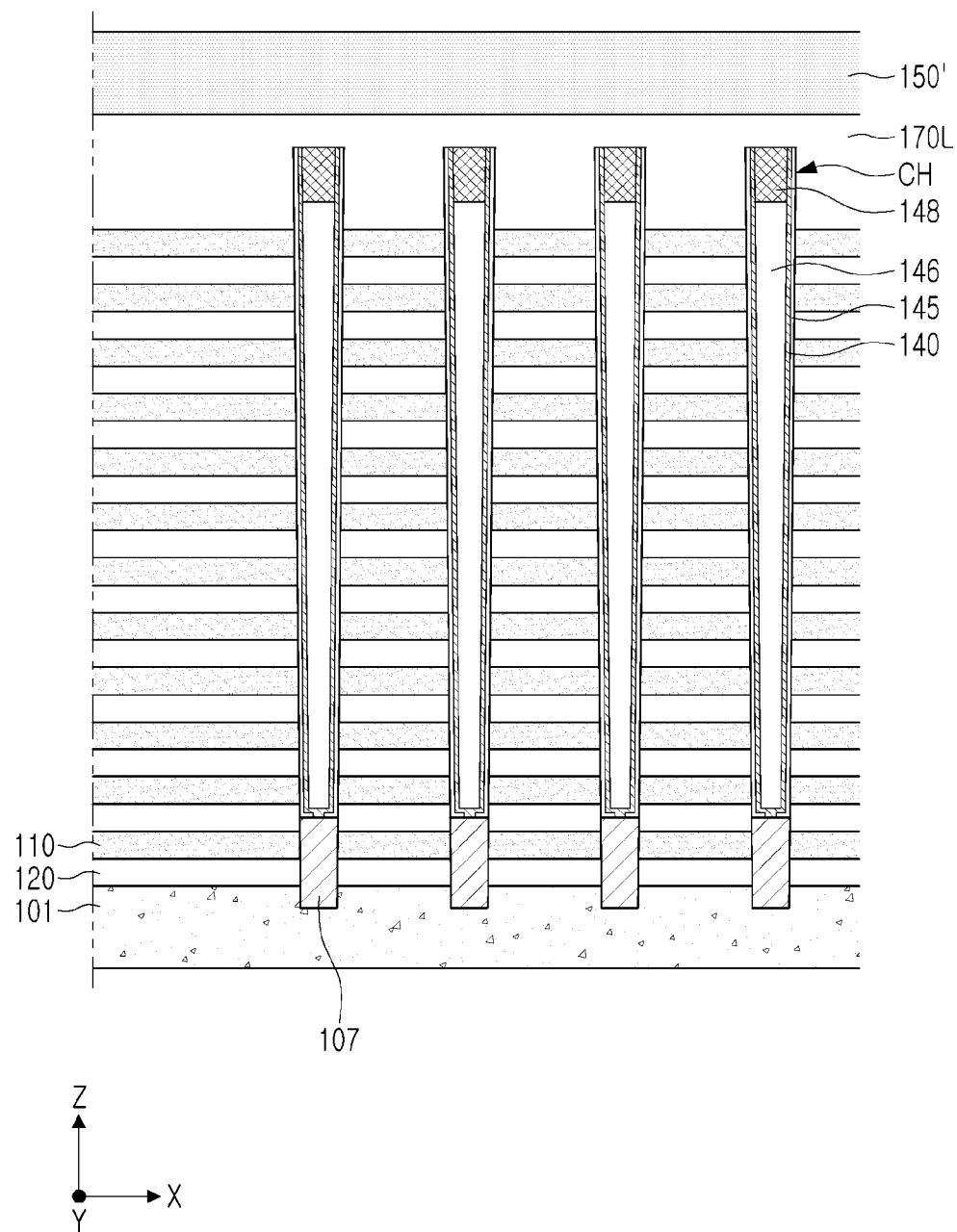

Referring to FIG. 10D, a lower insulating layer 170L may be formed to cover the channel structures CH, and a preliminary string select gate layer 150' may be formed on the lower insulating layer 170L.

The channel structures CH and the preliminary insulating layer 170' may be covered with an insulating material to form a lower insulating layer 170L together with the preliminary insulating layer 170'. The lower insulating layer 170L may cover uppermost gate layers 130 and the channel structure CH. The lower insulating layer 170L may include an insulating material such as a silicon oxide or a silicon nitride.

The preliminary string select gate layer 150' may be formed parallel to the substrate 101 and may have an upper surface extending in the horizontal direction. The preliminary string select gate layer 150' may be formed to be spaced apart from the horizontal sacrificial layers 110 and the channel structures CH by the lower insulating layer 170L. The preliminary string select gate layer 150' may include a semiconductor material such as polycrystalline silicon or single-crystalline silicon, and the semiconductor material may be an undoped material or a material including P-type and/or N-type impurities.

Figure 10E:
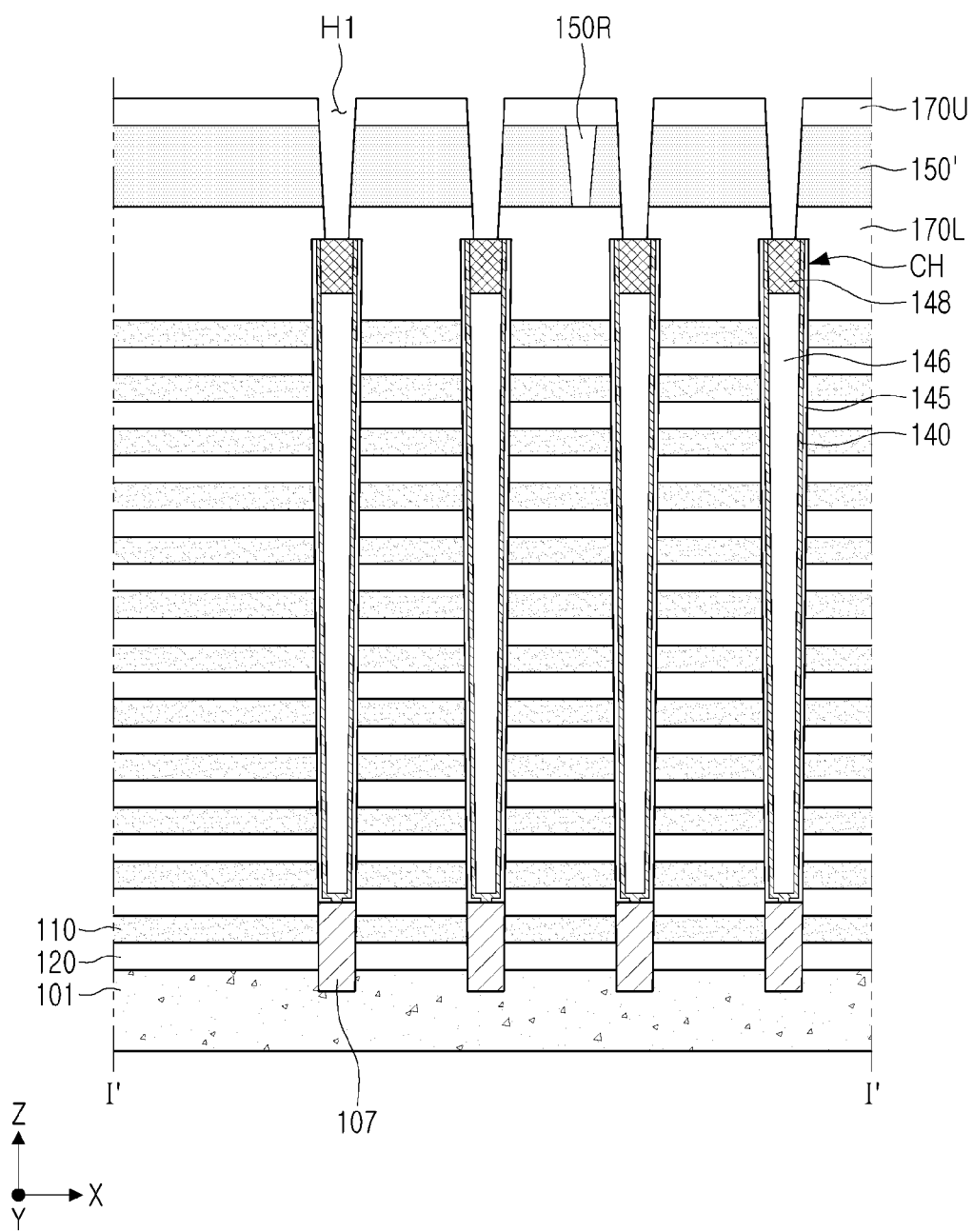

Referring to FIG. 10E, an upper separation region 150R may be formed to separate the preliminary string select gate layer 150' from each other at regular intervals in the X direction, an upper insulating layer 170U may be formed, and first holes H1 may be formed in the preliminary string 150'.

A portion of the preliminary string select gate layer 150' may be removed to separate the preliminary string select gate layer 150' from each other at regular intervals in the X direction. A region, in which the preliminary string select gate layer 150' is removed, may be a line-shaped region extending in the Y direction and, in some embodiments, may be a region extending in a zigzag pattern in one direction. The region, in which the preliminary string select gate layer 150' is removed, may be filled with an insulating material to form an upper separation region 150R.

An upper insulating layer 170U may be formed to cover the preliminary string select gate layer 150'. The upper insulating layer 170U may be a layer formed on the preliminary string select gate layer 150' while forming the upper separation region 150R after an upper portion thereof is planarized. The upper insulating layer 170U may include an insulating material such as a silicon oxide or a silicon nitride.

First holes H1 may be formed to penetrate through the upper and lower insulating layers 170U and 170L and the preliminary string select gate layer 150'. The first holes H1 may be formed by anisotropically etching the upper and lower insulating layers 170U and 170L and the preliminary string select gate layer 150', and may be formed in a hole shape. The first holes H1 may be formed to expose upper surfaces of the channel structures CH. For example, the first holes H1 may be formed to expose a portion of the upper surface of the channel pad 148.

Figure 10F:
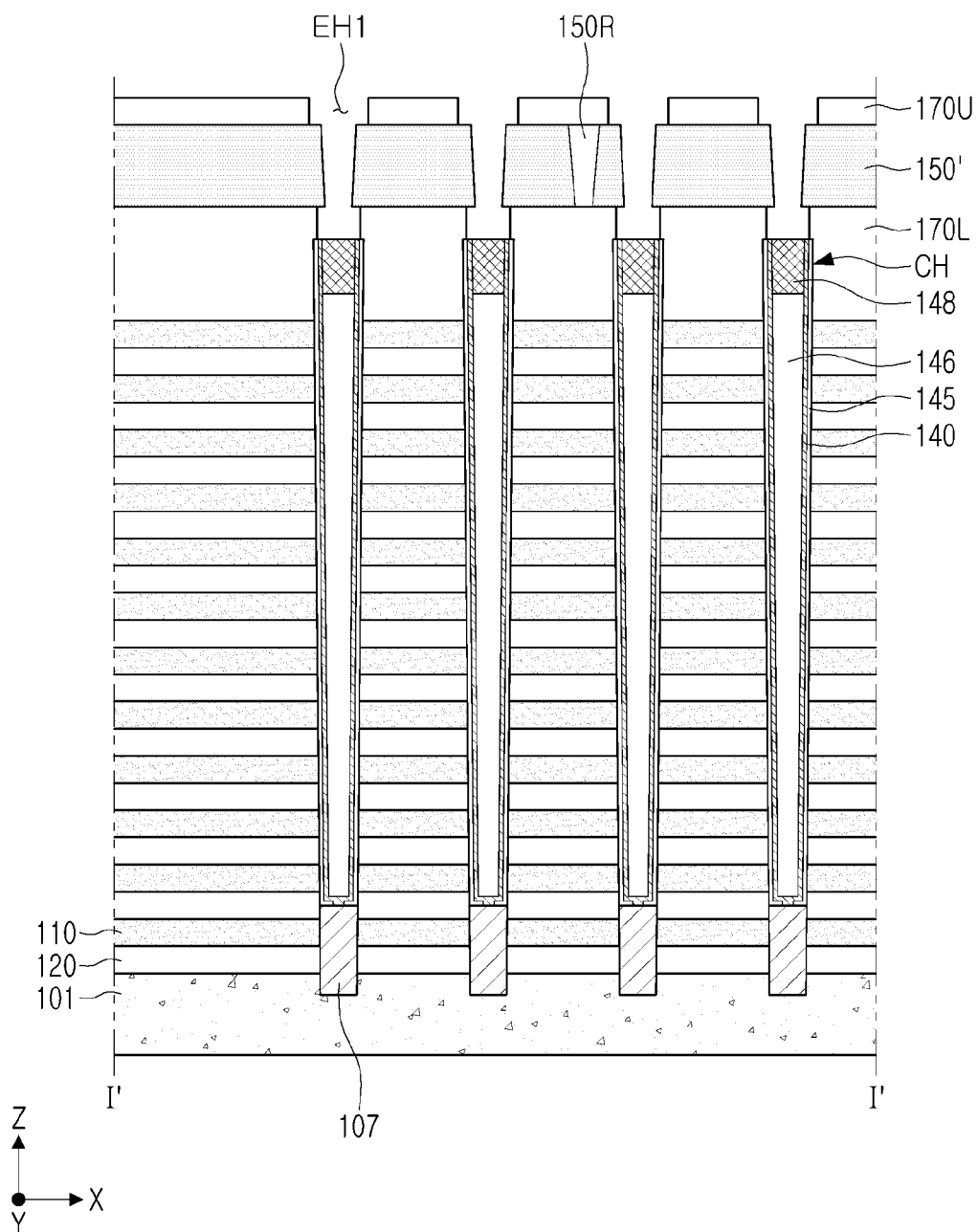

Referring to FIG. 10F, the first holes H1 may extend in a direction, parallel to the upper surface of the substrate 101, to form first extension holes EHE Portions of the upper and lower insulating layers 170U and 170L, adjacent to the first holes H1, may be removed such that the first extension holes EH1 may be formed to expose portions of upper and lower surfaces of the preliminary string select gate layers 150'. The first extension holes EH1 may be formed to further expose the upper surfaces of the channel structures CH. The first extension holes EH1 may be formed using, for example, a wet etching process. Portions of the upper and lower insulating layers 170U and 170L may be selectively removed with respect to the preliminary string select gate layer 150' and the channel structures CH using the wet etching process.

Figure 10G:
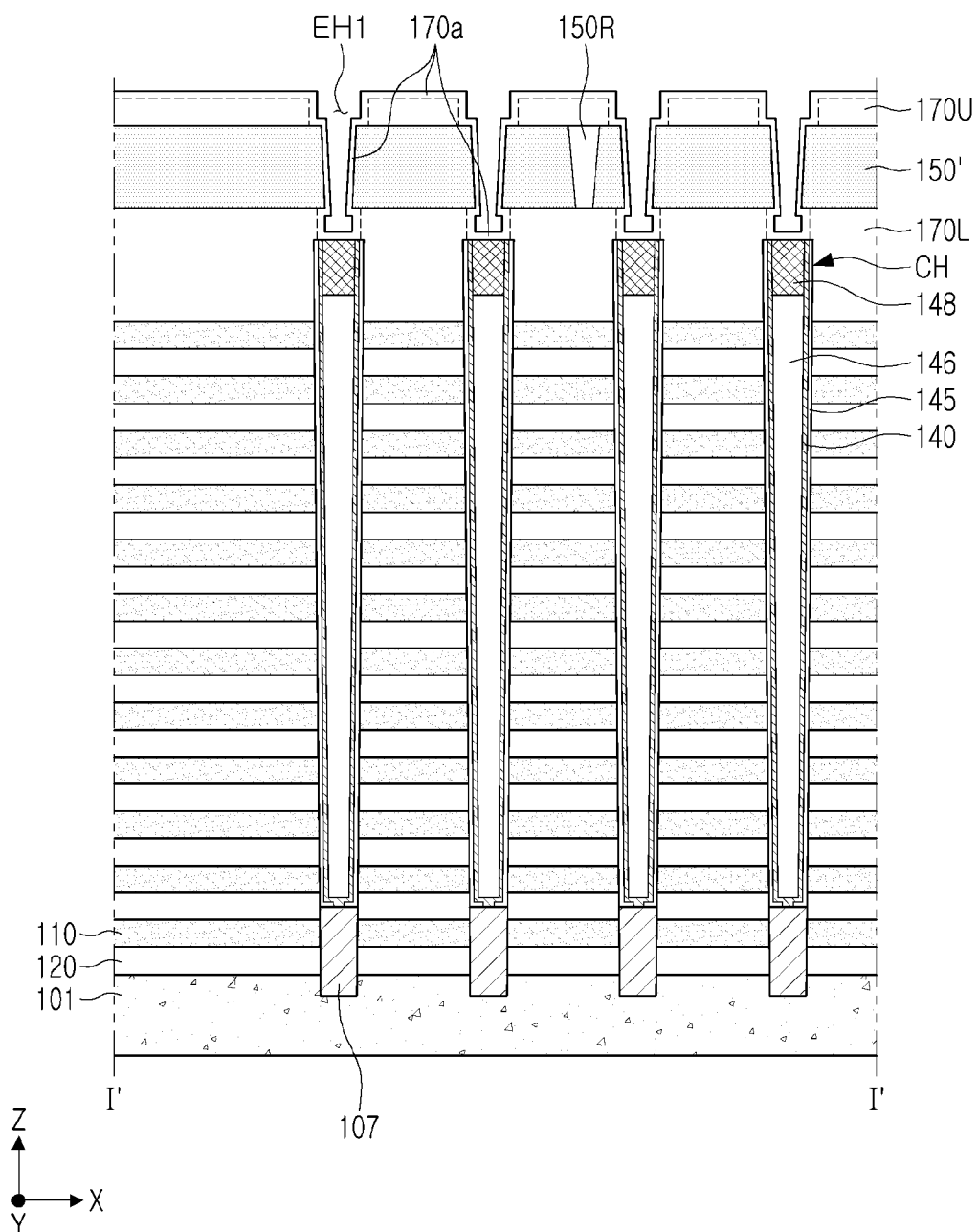

Referring to FIG. 10G, a first insulating pattern 170a may be formed to cover inner sidewalls of the first expansion holes EHE The first insulating pattern 170a may be formed using atomic layer deposition (ALD) or chemical vapor deposition (CVD). The first insulating pattern 170a may be formed to cover an upper surface and side surfaces of the upper insulating layer 170U and side surfaces of the lower insulating layer 170L. The first insulating pattern 170a may be formed to cover an upper surface, a lower surface, and side surfaces of the preliminary string select gate layer 150' exposed by the first extension holes EH1 and to cover the upper surfaces of the channel structures CH. The first insulating pattern 170a may be formed to have a uniform thickness along a shape of the inner walls of the first extension holes EHE The first insulating pattern 170a may include the same material as the upper and lower insulating layers 170U and 170L. The first insulating pattern 170a may include, for example, an insulating material such as a silicon oxide or a silicon nitride.

Figure 10H:
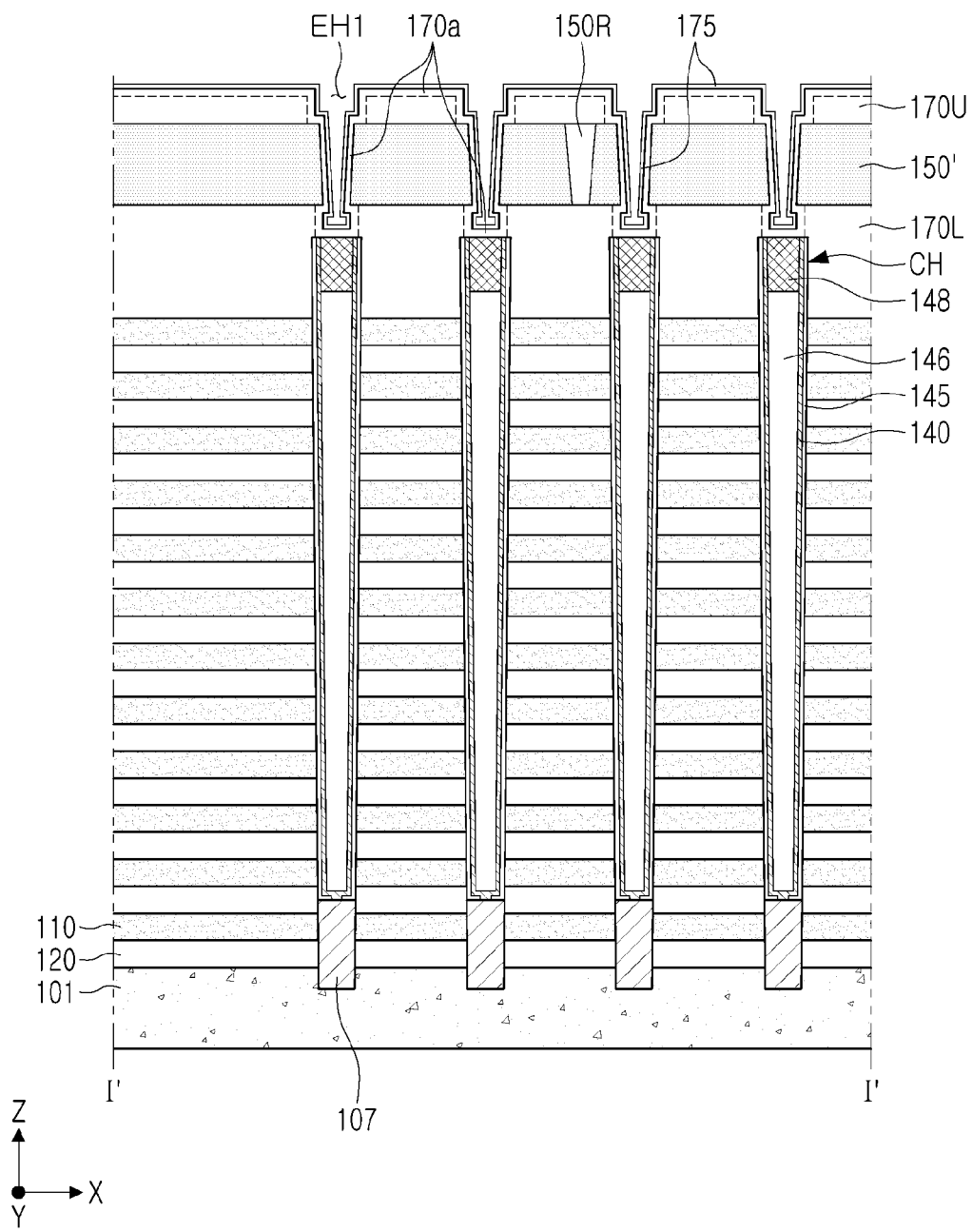

Referring to FIG. 10H, a spacer 175 may be formed to cover the first insulating pattern 170a.

The spacer 175 may be formed using atomic layer deposition (ALD) or chemical vapor deposition (CVD). The spacer 175 may be formed to have a substantially uniform thickness along the sidewall of the first insulating pattern 170a. The spacer 175 may include a material having an etch selectivity with respect to the upper and lower insulating layers 170U and 170L and the first insulating pattern 170a. The spacer 175 may include, for example, a silicon nitride (SiN).

Figure 10I:
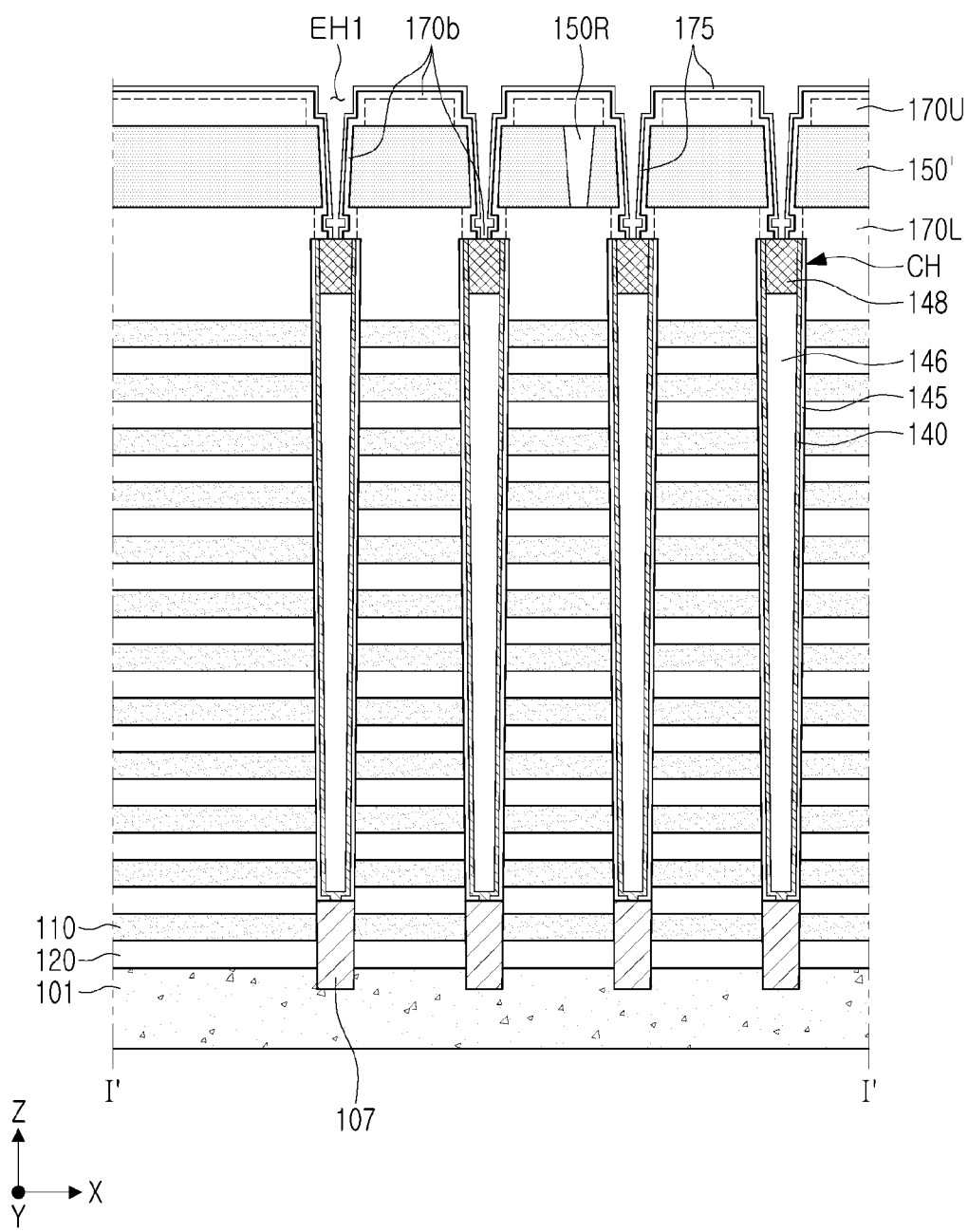

Referring to FIG. 10I, a lower portion of the spacer 175 may be removed to expose a lower portion of the first insulating pattern 170a, and the lower portion of the first insulating pattern 170a may be recessed to form a second insulating pattern 170b.

The lower portion of the spacer 175, covering the lower portion of the first insulating pattern 170a, may be removed by an etch-back process. As a result, a lower portion of the first insulating pattern 170a may be exposed. In the etch-back process, the first insulating pattern 170a, covering the upper surface and the side surfaces of the preliminary string select gate layer 150', may be protected by the spacer 175.

The lower portion of the first insulating pattern, exposed by the etch-back process, may be recessed to form a second insulating pattern 170. The second insulating pattern 170b may be formed by removing a portion of a lower portion the first insulating pattern 170a covering an upper surface of the channel pad 148. A portion of the upper surface of the channel pad 148 may be exposed by the recess. The lower portion of the first insulating pattern 170a may be removed to have a hole shape.

Figure 10J:
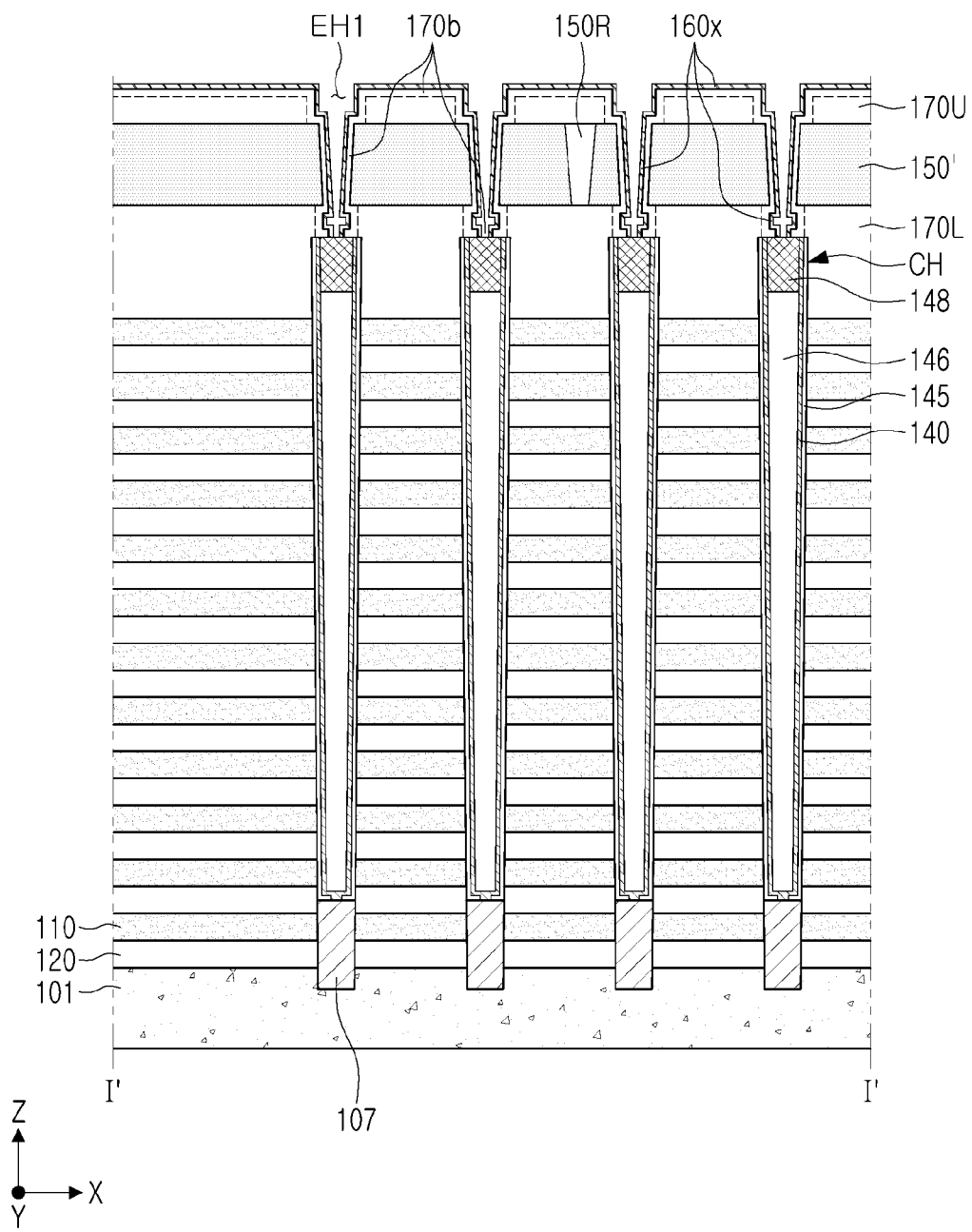

Referring to FIG. 10J, the spacer 175 may be removed and a preliminary string select channel layer 160x may be formed to cover the second insulating pattern 170b.

The preliminary string select channel layer 160x may be formed to have a substantially uniform thickness along the sidewall of the second insulating pattern 170b. The preliminary string select channel layer 160x may be in with the channel pad 148 having an upper surface exposed by the recess. The preliminary string select channel layer 160x may include a semiconductor material such as polycrystalline silicon or single-crystalline silicon, and the semiconductor material may be an undoped material or a material including P-type and/or N-type impurities.

Figure 10K:
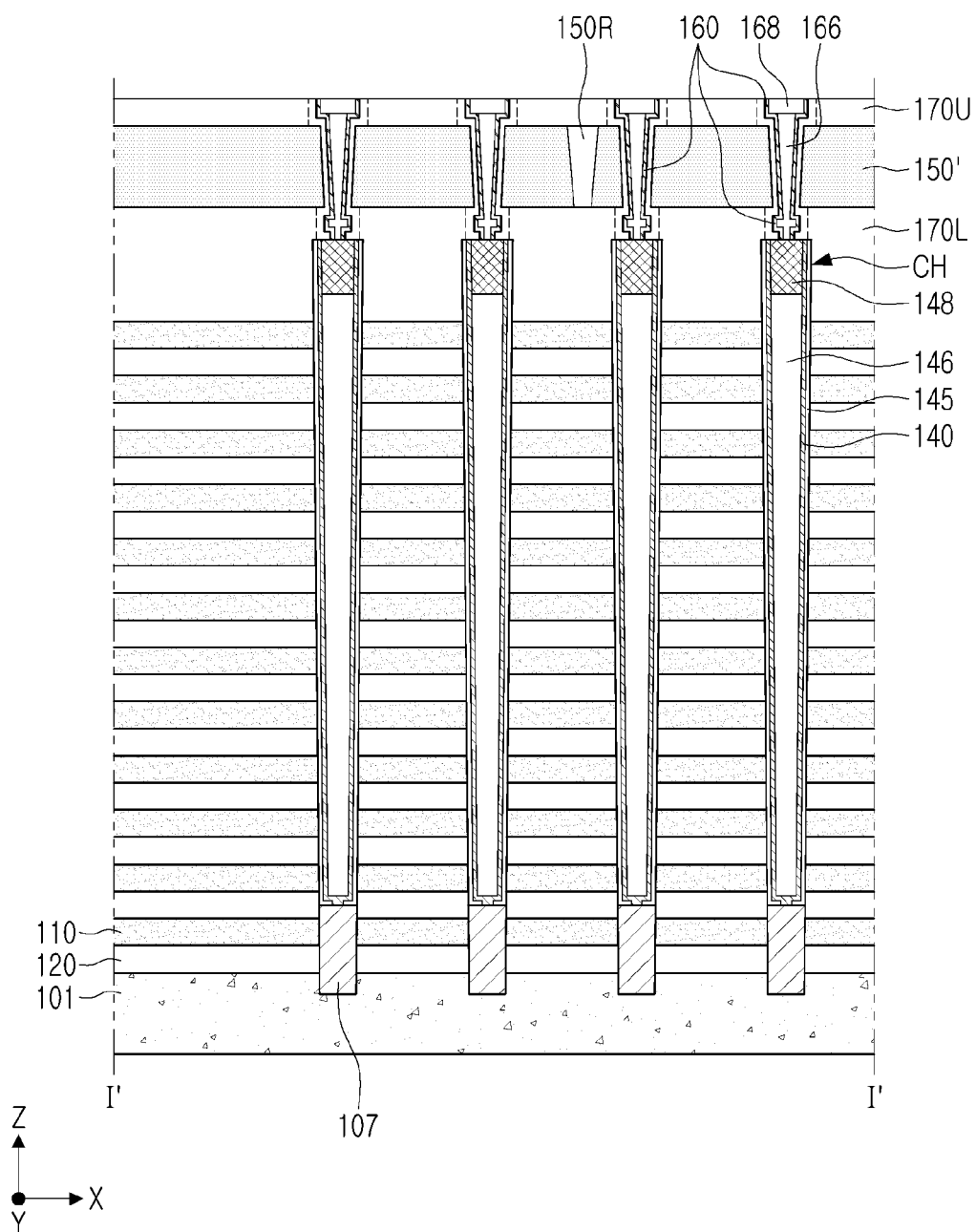

Referring to FIG. 10K, the string select insulating layer 166 may be formed to fill the first extension holes EH1, and the string select channel pad 168 may be formed on the string select insulating layer 166.

After the first extension holes EH1 is filled with an insulating material layer, the upper portion of the insulating material layer may be removed by an etch-back process. A semiconductor material such as polycrystalline silicon, forming the string select channel pad 168, may fill the region removed by the etch-back process, and a chemical mechanical polishing (CMP) process may be performed. The upper surfaces of the upper insulating layer 170U and the string select channel pad 168 may be planarized by the CMP process. A portion of the upper portion of the preliminary string select channel layer 160x may be removed to form string select channel layers 160. Thus, as illustrated in FIG. 4A, string select channel structures SCH including the string select channel layers 160, the string select insulating layer 166, and the string select channel pad 168 may be formed.

In other embodiments, in the operation of removing the upper portion of the insulating material layer using the etch-back process, the upper portion of the string select insulating layer 166 may be further recessed, such that the string select insulating layer 166 may be formed to have a recessed portion on the upper portion thereof, as illustrated in FIGS. 4D, 5C, and 6C. Other processes described hereafter may be further performed to fabricate a semiconductor device corresponding to the example embodiments of FIGS. 4D, 5C, and 6C.

Figure 10L:
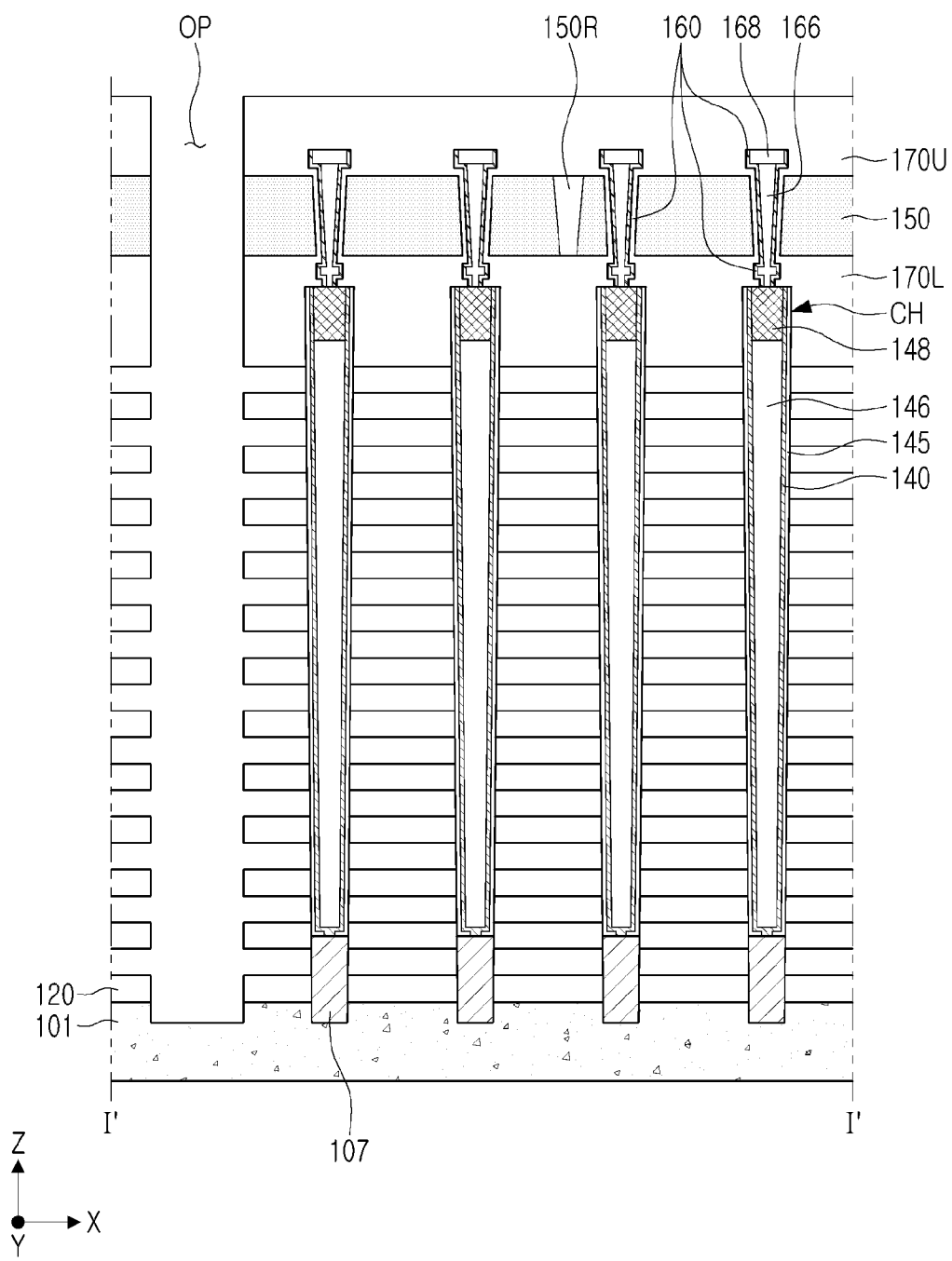

Referring to FIG. 10L, an opening OP may be formed to penetrate the stacked structure at predetermined intervals. Horizontal sacrificial layers 110 exposed through the openings OP may then be removed to form lateral openings.

In example embodiments, before formation of the opening OP, an insulating layer may be additionally formed on the upper insulating layer 170L and the string select channel pad 168 to prevent damage to the string select channel pad 168, the string select channel layers 160 provided therebelow, and the like. The opening OP may be formed by forming a mask layer using a photolithography process and anisotropically etching the stacked structure of the horizontal sacrificial layers 110 and the interlayer dielectric layers 120. The opening OP may be formed as a trench extending in the Y direction. The preliminary string select gate layer 150' may be separated by the opening OP to form string select gate layers 150.

The horizontal sacrificial layers 110 may be selectively removed with respect to the interlayer dielectric layers 120 using (e.g.,) a wet etching process. Thus, a plurality of lateral openings LT may be formed between the interlayer dielectric layers 120, and portions of sidewalls of the channel structures CH may be exposed through the lateral openings LT.

Referring to FIGS. 4A and 10L, the gate layers 130 may be formed by filling the lateral openings with a conductive material, separation insulating layers and a source conductive layer may be formed in the opening OP, and a stud 180 may be formed to be connected to the string select channel pad 168 through upper insulating layer 170U. Before formation of the gate layers 130, a gate blocking layer 135 may be formed in the lateral openings LT.

The conductive material may include a metal, polycrystalline silicon or a metal semiconductor compound. The separation insulating layers may be formed in the opening OP in the form of a spacer. For example, the separation insulating layers may be formed by depositing an insulating material and removing the insulating material formed on the substrate 101 on a lower portion of the opening OP. By depositing a conductive material on the separation insulating layers, a source conductive layer may be formed to form a separation region SR. However, according to example embodiments, the separation region SR may be filled with only separation insulating layers. The stud 180 may be formed by forming a hole to penetrate through the upper insulating layer 170U and filling the hole with a conductive material. As a result, the semiconductor device 100 shown, for example, in FIG. 4A may be fabricated.

FIGS. 11A to 11J are cross-sectional views illustrating in another example a method of fabricating a semiconductor device according to example embodiments. FIGS. 11A to 11J illustrate cross sections corresponding to FIG. 5A.

Figure 11A:
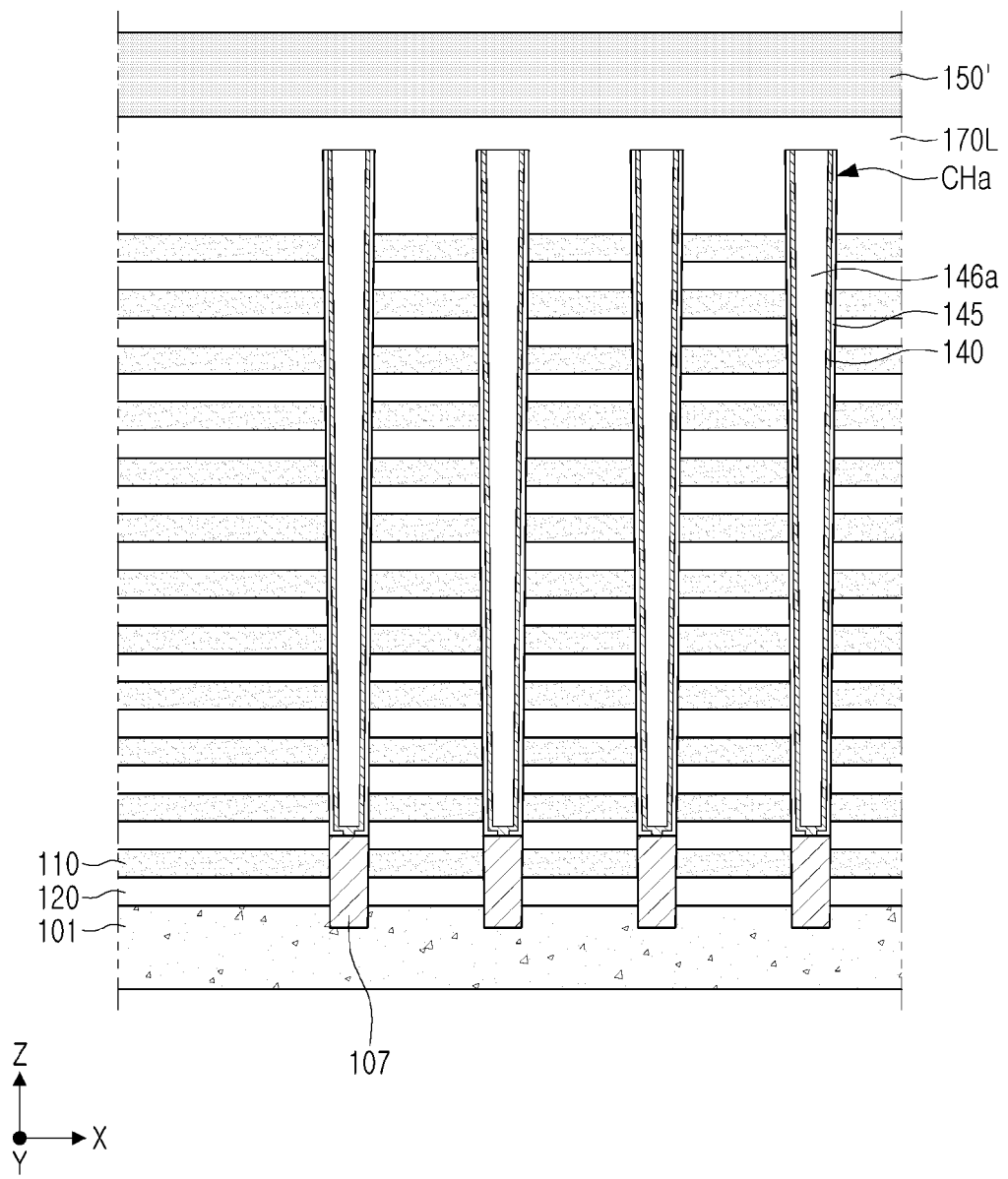
FIGS. 11A through 11J, inclusive, are related cross-sectional views illustrating a method of fabricating a semiconductor device according to example embodiments.

Referring to FIG. 11A, the same processes as described above with reference to FIGS. 10A to 10B may be performed to form a stacked structure and to form channel holes CHH and epitaxial layers 107.

The same process as described above with reference to FIG. 10C may be performed, but a channel pad 148 may not be formed. A gate dielectric layer 145, a channel layer 140, and a channel insulating layer 146a may be formed in the channel holes CHH to form channel structures CHa.

The same process as described above with reference to FIG. 10D may be performed to form a lower insulating layer 170L covering the channel structures CHa and to form a preliminary string select gate layer 150' on the lower insulating layer 170L, as illustrated in FIG. 11A.

Figure 11B:
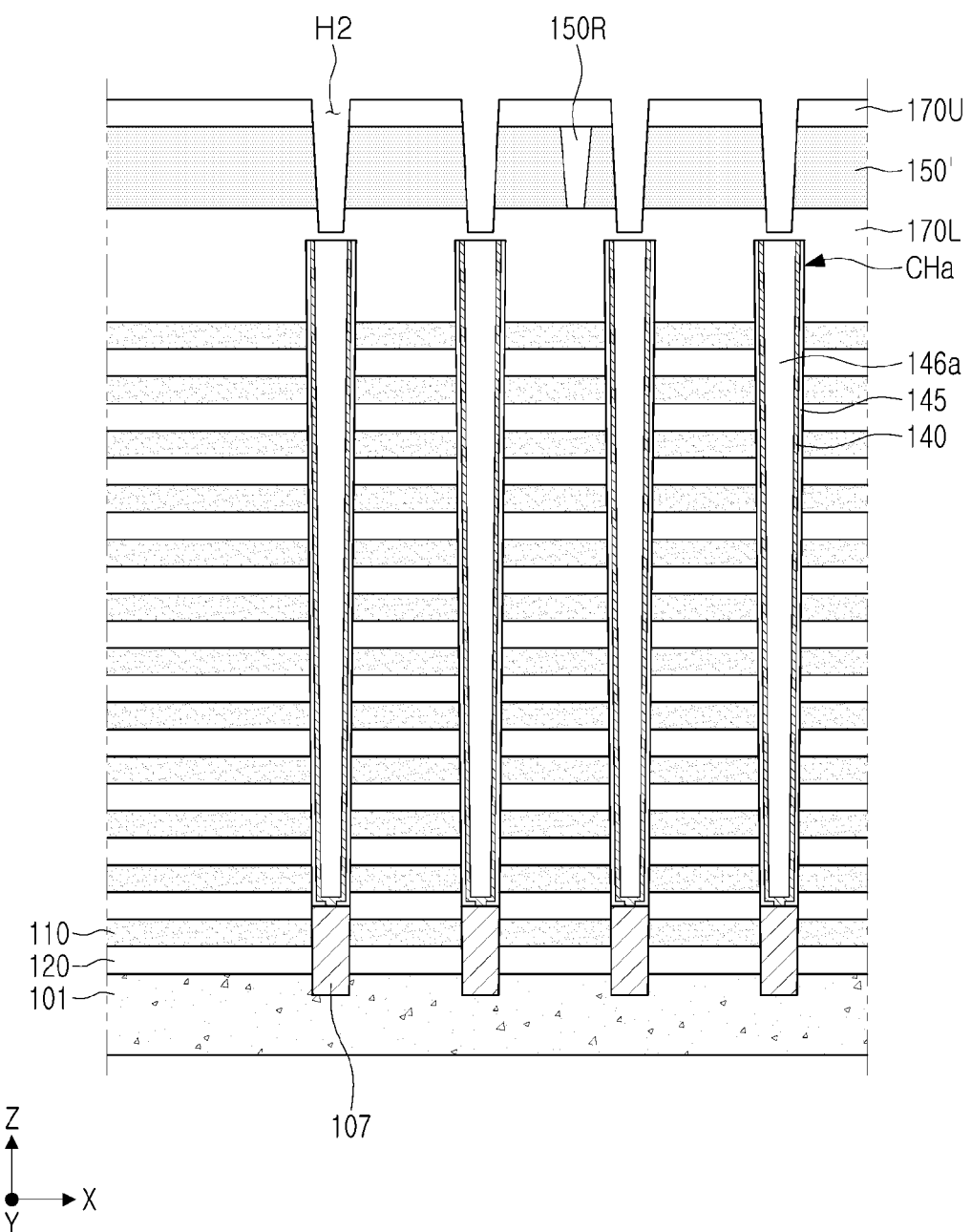

Referring to FIG. 11B, an upper separation region 150R may be formed to separate the preliminary string select gate layer 150' from each other at regular intervals in an X direction, an upper insulating layer 170U may be formed, and second holes H2 may be formed in the preliminary string select gate layer 150'.

The same description as given above with reference to FIG. 10E may be applied to the process of forming the upper separation region 150R and the upper insulating layer 170U.

Second holes H2 may be formed to penetrate through the upper and lower insulating layers 170U and 170L and the preliminary string select gate layer 150'. The second holes H2 may be formed by anisotropically etching the upper and lower insulating layers 170U and 170L and the preliminary string select gate layer 150', and may be formed in a hole shape. The second holes H1 may be formed such that lower surfaces thereof are disposed between the channel structures CH and the preliminary string select gate layer 150'. For example, lower surfaces of the second holes H2 may be higher than an upper surface of the channel layer 140. The disposition and/or number of the second holes H1 is not limited thereto.

Figure 11C:
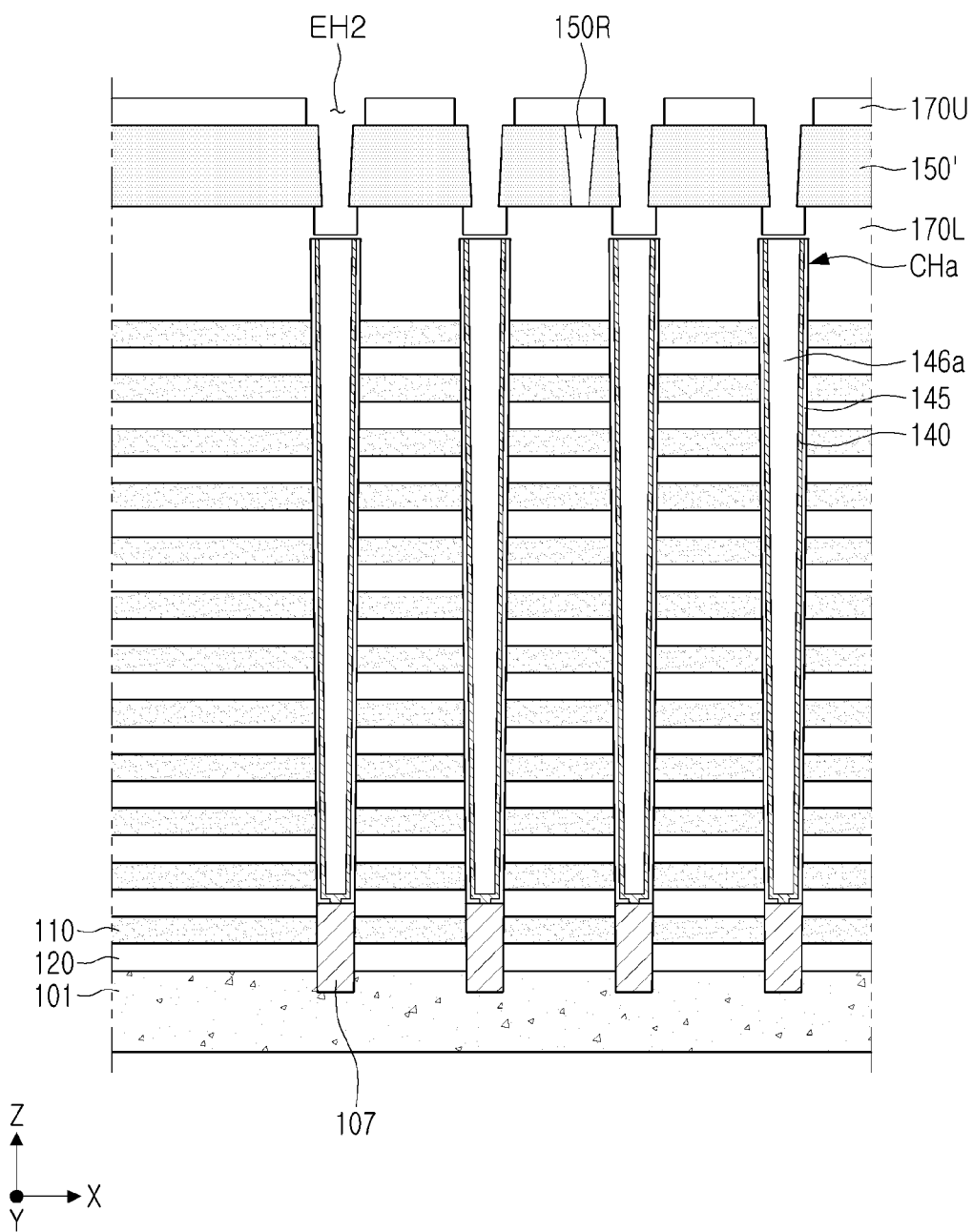

Referring to FIG. 11C, the second holes H2 may extend in a direction, parallel to an upper surface of the substrate 101, to form second extension holes EH2.

By removing portions of the first extension holes EH2, first extension holes EH2 may be formed to expose upper and lower surfaces of the preliminary string select gate layer 150'. The second extension holes EH2 may be formed using, for example, a wet etching process. Portions of the upper and lower insulating layers 170U and 170L may be selectively removed with respect to the preliminary string select gate layer 150' using the wet etching process.

Figure 11D:
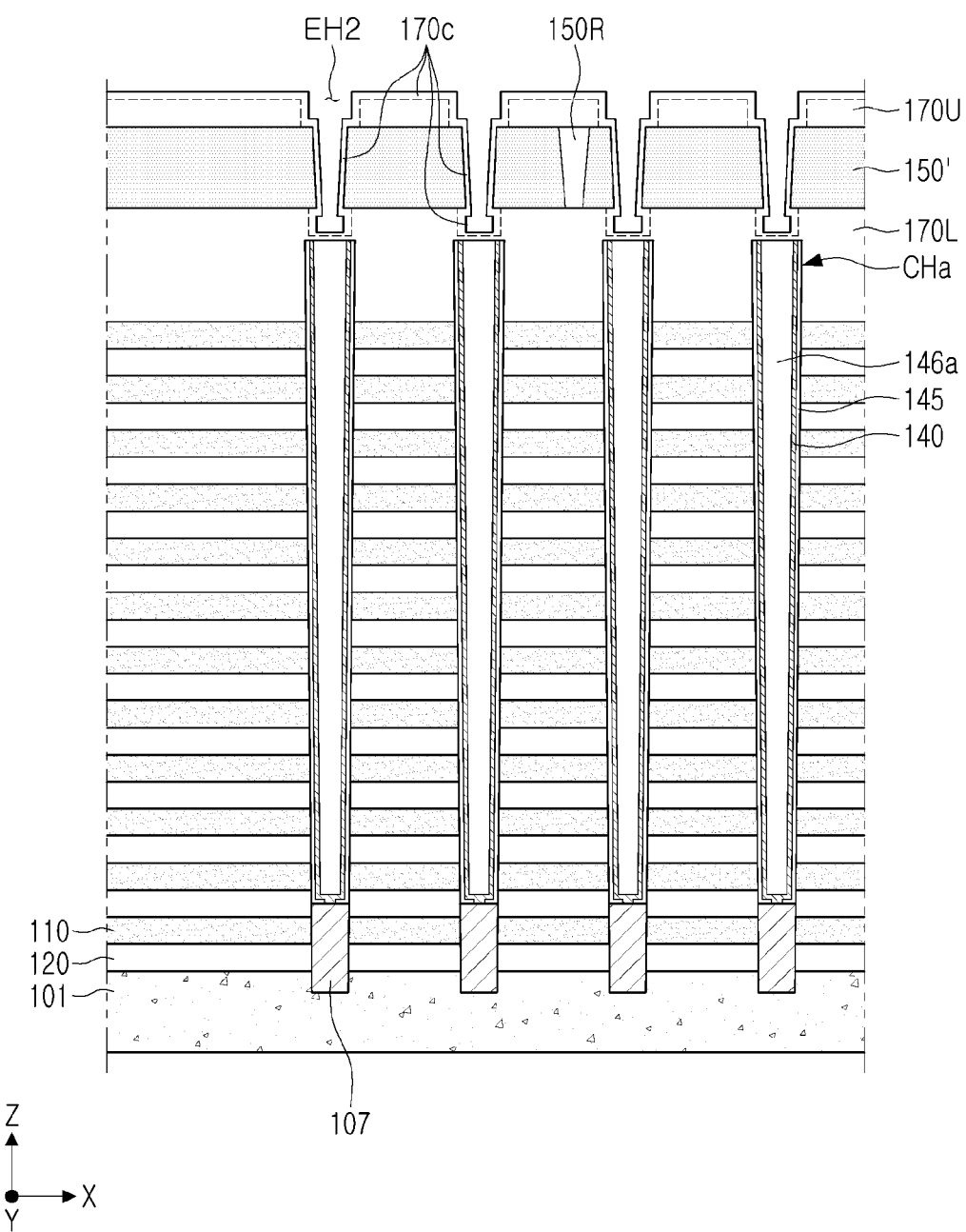

Referring to FIG. 11D, a third insulating pattern 170c may be formed to cover inner sidewalls of the second extension holes EH2.

The third insulating pattern 170c may be formed using atomic layer deposition (ALD) or chemical vapor deposition (CVD). The third insulating pattern 170c may be formed to cover an upper surface and side surfaces of the upper insulating layer 170U and side surfaces of the lower insulating layer 170L. The third insulating pattern 170c may cover an upper surface, a lower surface, and side surfaces of the preliminary string select gate layer 150' exposed by the second extension holes EH2. The third insulating pattern 170c may be formed to have a uniform thickness along a shape of the inner sidewalls of the second extension holes EH2. The third insulating pattern 170c may include the same material as the upper and lower insulating layers 170U and 170L. For example, the third insulating pattern 170c may include an insulating material such as a silicon oxide or a silicon nitride.

Figure 11E:
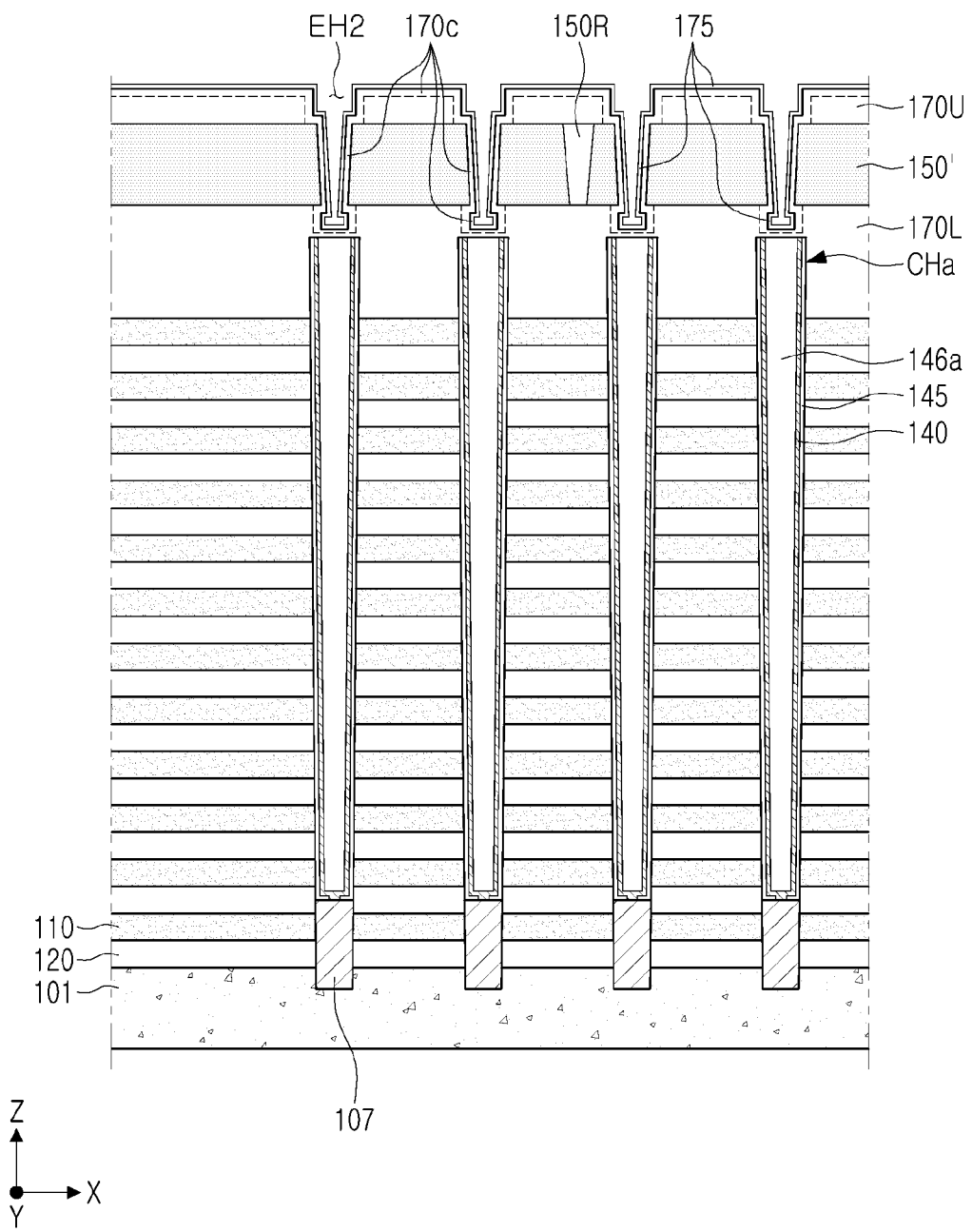
Figure 11F:
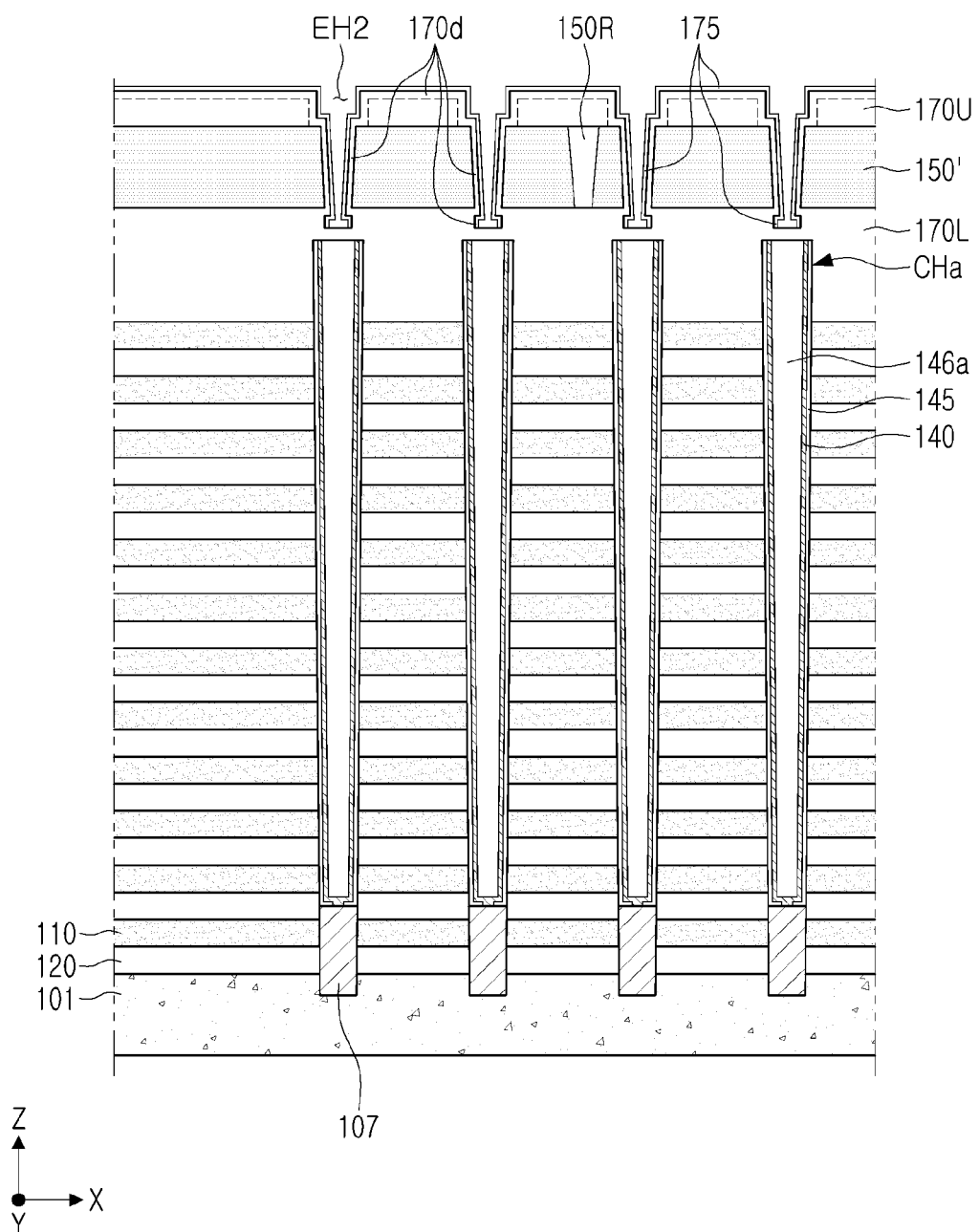

Referring to FIGS. 11E and 11F, a spacer 175 may be formed to cover the third insulating pattern 170c, and a lower portion of the spacer 175 may be removed to expose a lower portion of the third insulating pattern 170c.

The same descriptions as give above with reference to FIGS. 10H and 10I may be applied to the processes of forming the spacer 175 and removing a portion of the spacer 175.

Figure 11G:
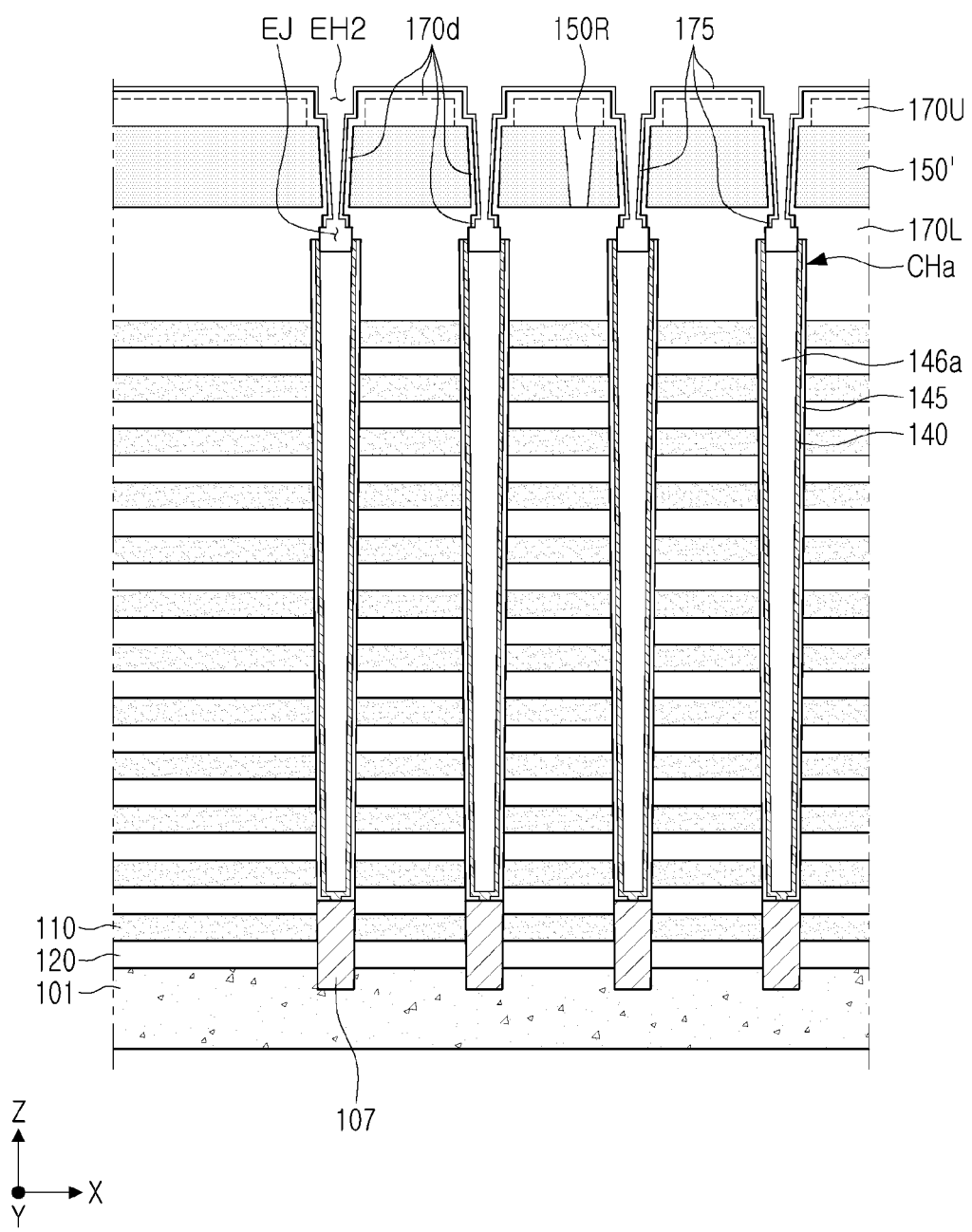

Referring to FIG. 11G, while recessing a lower portion of the third insulating pattern 170c to form a fourth insulating pattern 170d, lower portions of the second extension holes EH2 may extend in a direction, parallel to the surface of the substrate 101, to form an extension junction region EJ.

The lower portion of the third insulating pattern 170c may be recessed by an etch-back process to form the fourth insulating pattern 170d. The fourth insulating pattern 170d may be formed by removing the lower portion of the third insulating pattern 170c, exposed in FIG. 11F, and a region adjacent to the exposed lower portion thereof.

The extension junction region EJ may be formed using, for example, a wet etching process. A portion of the lower insulating layer 170L and an upper portion of the channel insulating layer 146 may be selectively removed with respect to the channel layer 140 and the spacer 175 using the wet etching process. The extension junction region EJ may be a region formed by removing a portion of the lower insulating layer 170L in a direction, parallel to the upper surface of the substrate 101, while recessing the upper portion of the channel insulating layer 146. The extension junction region EJ may be formed to expose an inner sidewall of the channel layer 140 while recessing the upper portion of the channel insulating layer 146. In this operation, as described above with reference to FIG. 10I, the preliminary string select gate layer 150' and the third insulating pattern 170c may be protected by the spacer 175.

In other embodiments, in the operation of performing the etch-back process or the wet etching process, the extension junction region EJ may further extend in a direction, parallel to the upper surface of the substrate 101, to expose an upper surface of the channel layer 140. Other processes to be described later may be further performed, such that string select channel layers 160 are formed to cover the upper surface of the channel layer 140. As a result, a semiconductor device corresponding to the example embodiment of FIGS. 6A, 6B and 6C may be fabricated.

Figure 11H:
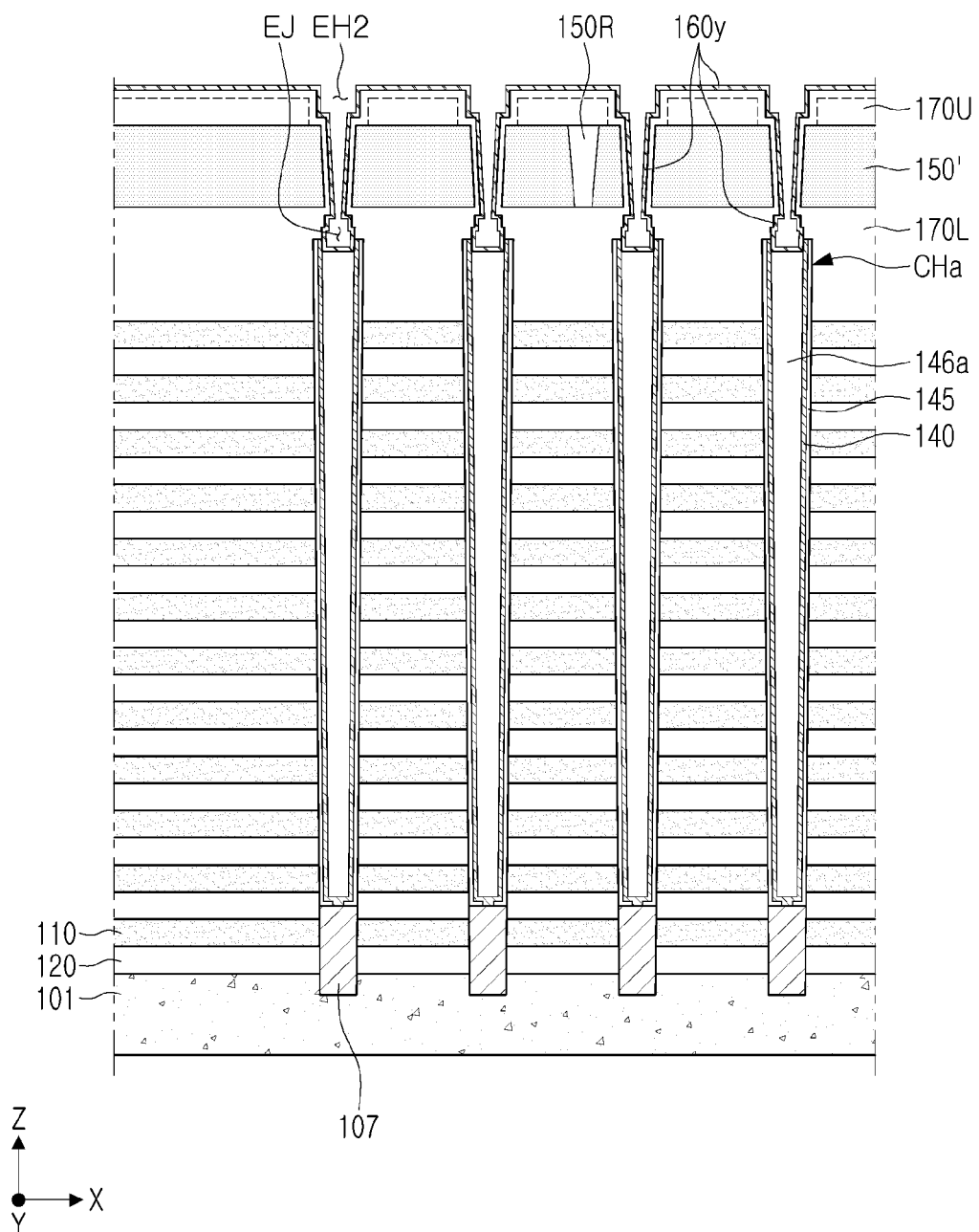

Referring to FIG. 11H, the spacer 175 may be removed, and a preliminary string select channel layer 160y may be formed to cover the fourth insulating pattern 170d and the inner sidewall of the extended junction region EJ.

The preliminary string select channel layer 160y may be formed to have a substantially uniform thickness along the sidewall of the fourth insulating pattern 170d and the inner sidewall of the extension junction region EJ. The preliminary string select channel layer 160y may be formed to be in direct contact with the upper portion of the channel layer 140 exposed during the wet etching process of FIG. 11G. The preliminary string select channel layer 160y may include a semiconductor material such as polycrystalline silicon or single-crystalline silicon, and the semiconductor material may be an undoped material or a material including P-type and/or N-type impurities.

Figure 11I:
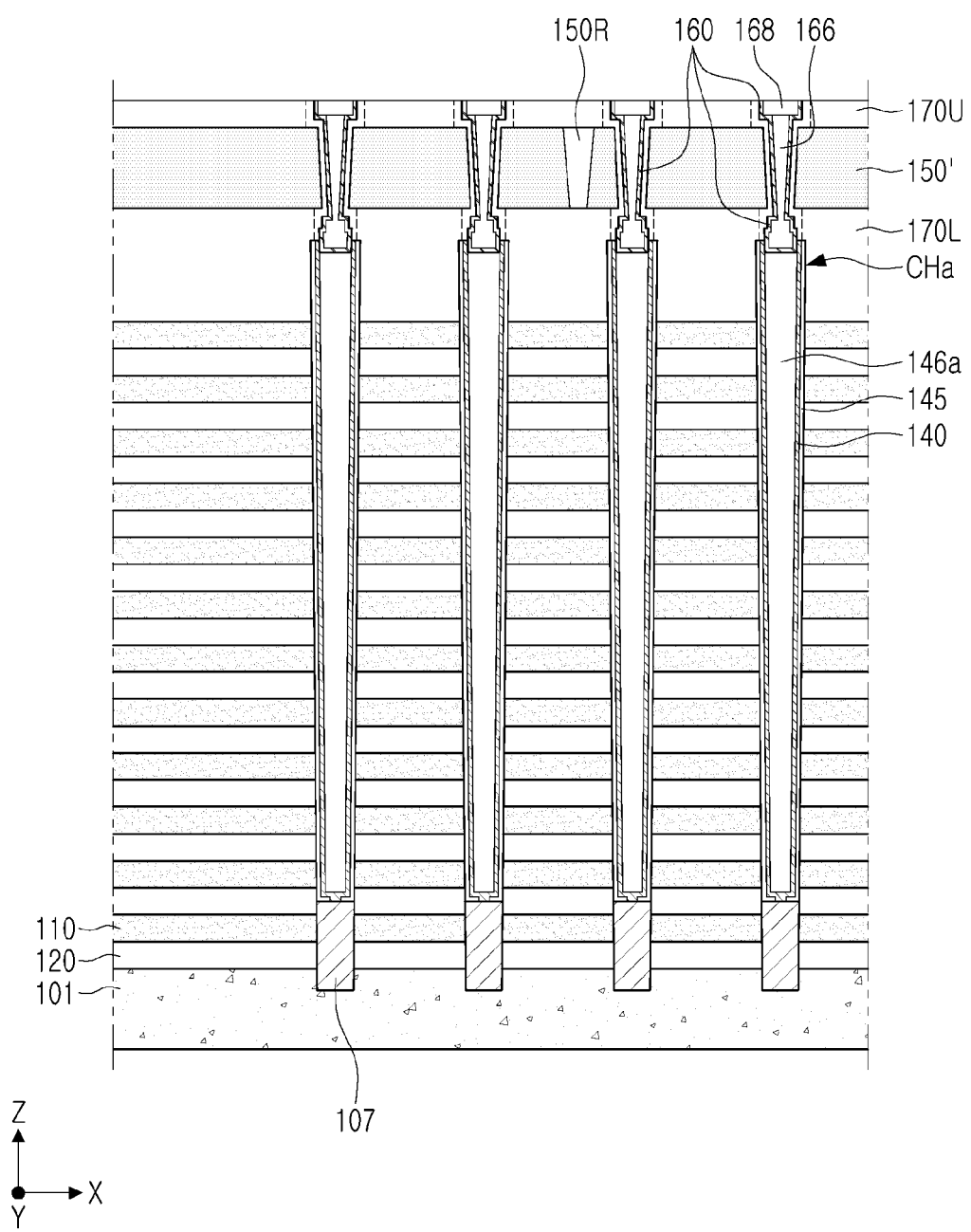

Referring to FIG. 11I, a string select insulating layer 166a may be formed to fill the second extension holes EH2 and the extension junction region EJ, and a string select channel pad 168 may be formed on the string select insulating layer 166a.

The same description as given above with reference to FIG. 10K may be applied to the process of forming the string select insulating layer 166a and the string select channel pad 168. In this operation, a portion of an upper portion of the preliminary string select channel layer 160y may be removed to form string select channel layers 160. Thus, a string select channel structures SCH including the string select channel layers 160, the string select insulating layer 166a, and the string select channel pad 168 may be formed, as illustrated in FIG. 5B.

Figure 11J:
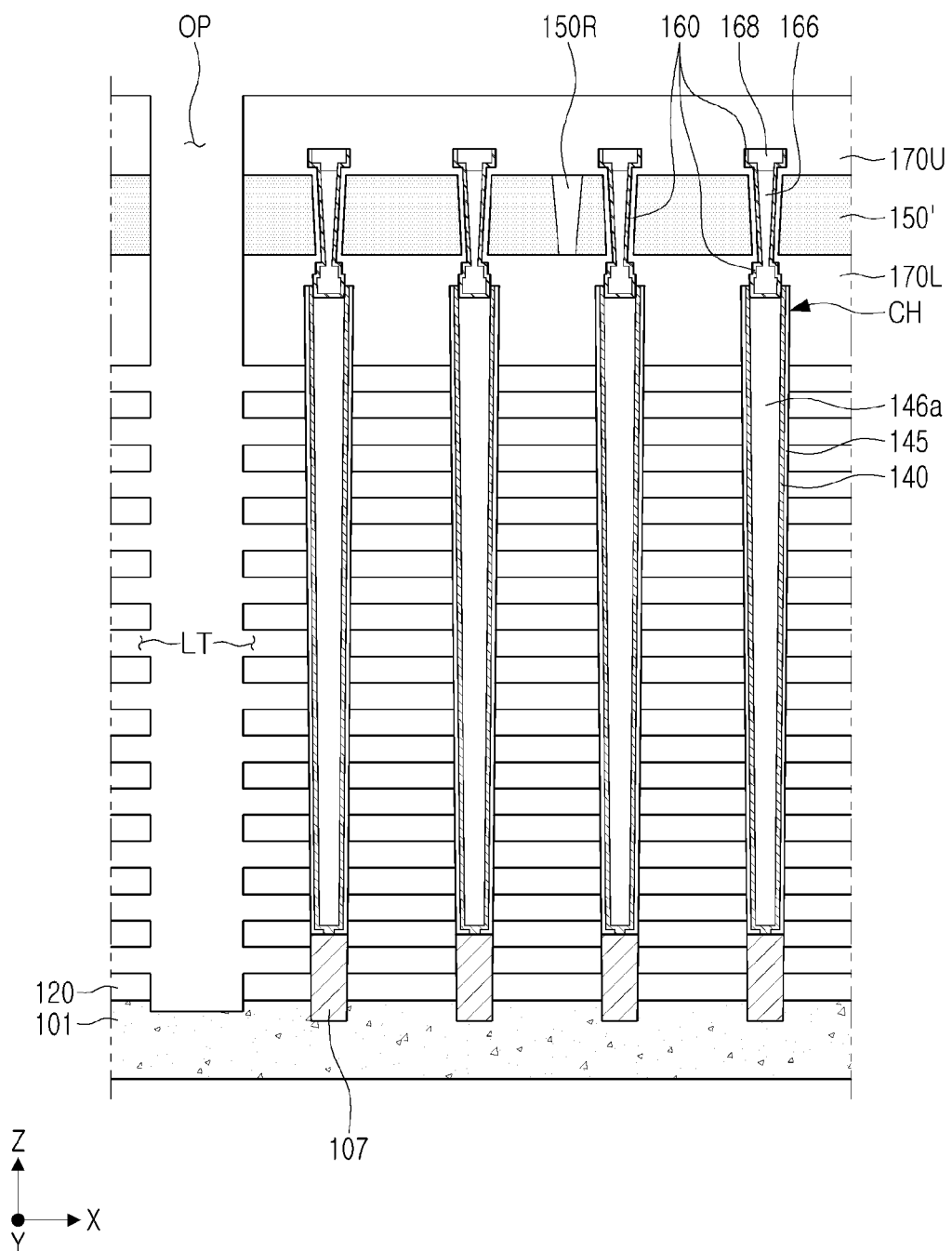

Referring to FIG. 11J together with FIG. 5A, an opening OP may be formed to separate and penetrate through the stacked structure at predetermined intervals and the horizontal sacrificial layers 110, exposed through the opening OP, may be removed to form lateral openings LT. The lateral openings LT may be filled with a conductive material to form gate layers 130, separation insulating layers and a source conductive layer may be formed in the opening OP, and a stud 180 may be formed connected to the string select channel pad 168 through the upper insulating layer 170U.

The same descriptions as given above with reference to FIG. 10L may be applied to the processes of forming the opening OP, the lateral openings LT, the gate layers 130, the separation insulating layers, the source conductive layer, and the stud 180. As a result, the semiconductor device 100b of FIG. 5A may be fabricated.

Figure 12A:
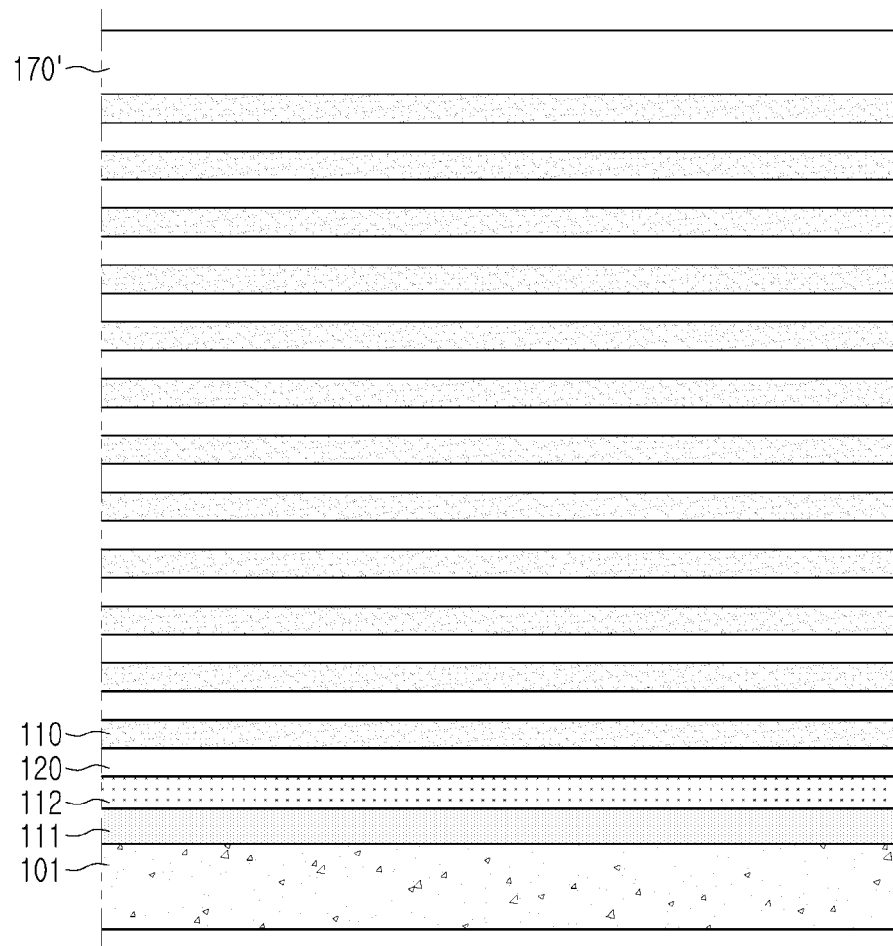
FIGS. 12A and 12B are cross-sectional views illustrating a method of fabricating a semiconductor device according to example embodiments.
Figure 12B:
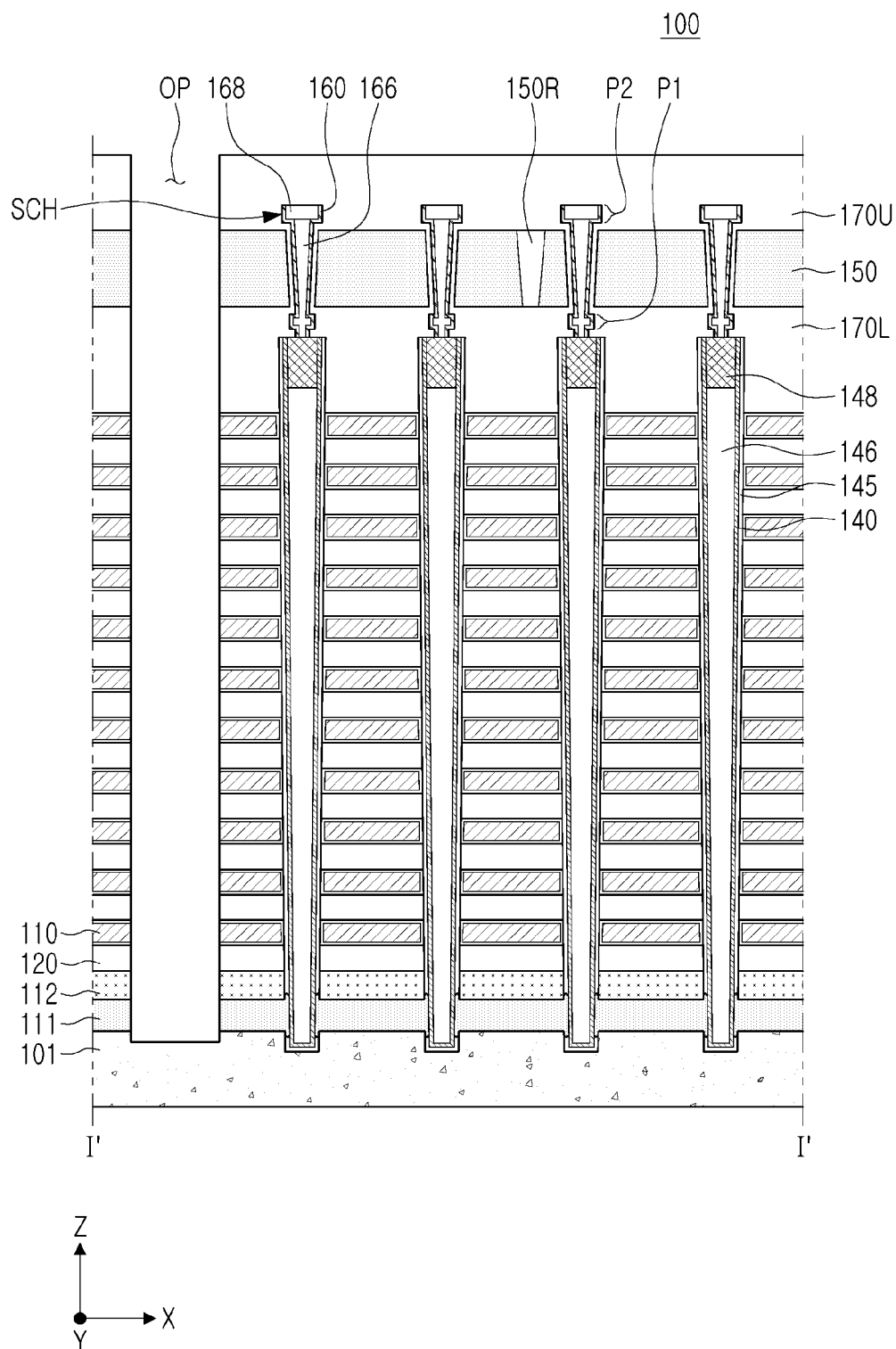

FIGS. 12A and 12B are cross-sectional views illustrating another example a method of fabricating a semiconductor device according to example embodiments. FIGS. 12A and 12B illustrate cross sections corresponding to FIG. 7.

Referring to FIG. 12A, first and second source sacrificial layers 111 and 112 and a second conductive layer 105 may be formed on a substrate 101, and horizontal sacrificial layers 110 and interlayer dielectric layers may be alternately stacked to form a stacked structure.

The first and second source sacrificial layers 111 and 112 may include different materials to each other, and may be stacked on the substrate 101 such that the first source sacrificial layers 111 are disposed above and below the second source sacrificial layer 112. The first and second source sacrificial layers 111 and 112 may be replaced with the first conductive layer 104 in FIG. 7 through a subsequent process. For example, the first source sacrificial layer 111 may be formed of the same material as the interlayer dielectric layers 120, and the second source sacrificial layer 112 may be formed of the same material as the horizontal sacrificial layers 110. The second conductive layer 105 may be deposited on the first and second source sacrificial layers 111 and 112.

Similarly to the description given above with reference to FIG. 10A, horizontal sacrificial layers 110, interlayer dielectric layers 120, and a preliminary insulating layer 170' may be formed on the second conductive layer 105.

Referring to FIG. 12B, the same processes as described with reference to FIGS. 10B to 10K may be performed to form channel structures CH, preliminary string select gate layers 150', and string select channel structures SCH. In this embodiment, the channel layers 140 and the gate dielectric layer 145 may be formed on lower ends of channel holes CHH to extend inwardly of the substrate 101.

As illustrated in FIG. 12B, an opening OP may be formed to penetrate through the stacked structure of the horizontal sacrificial layers 110, the first and second source sacrificial layers 111 and 112, and the interlayer dielectric layers 120. After the first and second source sacrificial layers 111 and 112 are removed through the opening OP, a first conductive layer 104 may be formed.

In example embodiments, before removal of the first and second source sacrificial layers 111 and 112, a spacer layer may be formed on a sidewall of the opening OP to protect the horizontal sacrificial layers 110. After removal of the second source sacrificial layer 112 through the opening OP, the first source sacrificial layers 111 may be removed. The first and second source sacrificial layers 111 and 112 may be removed by, for example, a wet etching process. In the process of removing the first source sacrificial layers 111, a portion of the gate dielectric layer 145, exposed in a region in which the second source sacrificial layer 112 is removed, may also be removed. After the first conductive layer 104 is formed by depositing a conductive material on a region in which the first and second source sacrificial layers 111 and 112 are removed, the spacer layer may be removed. The first conductive layer 104 may be in direct contact with the channel layer 140 in the region in which the gate dielectric layer 145 is removed.

As described with reference to FIG. 10L, the horizontal sacrificial layers 110 may be removed through the opening OP, and the same process as described with reference FIG. 4A may be performed to fabricate the semiconductor device 100F of FIG. 7.

As described above, string select channel layers may include a plurality of regions having different width to each other. Thus, electrical connection characteristics of a string select channel pad and an upper interconnection may be improved.

In addition, the string select channel layers may be in direct contact with channel layers to improve connection characteristics of transistors. Thus, a semiconductor device having improved integration density and improved electrical characteristics may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
an alternating arrangement of gate layers and interlayer dielectric layers stacked on a substrate;
a channel structure vertically extending through the alternating arrangement of gate layers and interlayer dielectric layers;
a string select gate layer disposed on the channel structure; and
a string select channel layer vertically extending through the string select gate layer to contact the channel structure, wherein:
the string select channel layer includes:
a first portion below the string select gate layer;
a second portion extending through the string select gate layer, and
a third portion above the string select gate layer; and
at least one of the first portion and the third portion includes a protruding region,
a lower surface of the first portion of the string select channel layer is disposed lower than upper surfaces of the channel structure,
the first portion includes a pedestal protruding region including a lower pedestal part seated between inner side surfaces of the channel structure and an upper pedestal part disposed on the lower pedestal part,
the lower pedestal part has a first region width, and
the upper pedestal part has a second region width less than the first region width and greater than a width of the first portion of the string select channel layer contacting the second portion of the string select channel layer.

2. The semiconductor device of claim 1, wherein the first portion includes:
a first protruding region having a first width greater than a second width of an upper part of the first portion contacting the second portion, and
a third width of a lower part of the first portion contacting the channel structure.

3. The semiconductor device of claim 2, wherein the third portion includes a second protruding region having a fourth width greater than a fifth width of a lower part of the third portion contacting the second portion.

4. The semiconductor device of claim 3, further comprising a string select channel pad seated between inner side surfaces of the third portion of the string select channel layer and disposed in the second protruding region.

5. The semiconductor device of claim 4, wherein the string select channel pad includes a portion extending downwardly from the second protruding region.

6. The semiconductor device of claim 1, wherein:
the second portion of the string select channel layer extends through a hole formed through the string select gate layer, and
the second portion has a width less than a width of the hole.

7. The semiconductor device of claim 6, further comprising a string select gate insulating layer surrounding the second portion of the string select channel layer in the hole.

8. The semiconductor device of claim 1, wherein the first portion includes a plug protruding region including:
a lower part seated between inner side surfaces of the channel structure;
a middle part disposed on the lower part and overlapping upper surfaces of the channel structure; and
an upper part disposed on the middle part.

9. The semiconductor device of claim 8, wherein:
the lower part has a first region width,
the middle part has a second region width greater than the first region width, and
the upper part has a third region width less than the second region width and greater than a width of the first portion of the string select channel layer contacting the second portion of the string select channel layer.

10. The semiconductor device of claim 9, wherein:
the channel structure includes a channel layer, and
a lower surface of the middle part of the plug protruding region contacts an upper surface of the channel layer.

11. The semiconductor device of claim 1, further comprising a peripheral circuit region disposed below the substrate and including a base substrate and circuit elements disposed on the base substrate.

12. A semiconductor device comprising:
gate layers stacked on a substrate;
a channel layer extending through the gate layers;
a string select gate layer disposed on the channel layer; and
a string select channel layer extending through the string select gate layer to contact the channel layer, wherein:
the string select channel layer includes:
a first portion below the string select gate layer including a first protruding region;
a second portion extending through the string select gate layer; and
a third portion above the string select gate layer including a second protruding region,
a lower surface of the first portion of the string select channel layer is disposed lower than upper surfaces of the channel layer,
the first portion includes a pedestal protruding region including a lower pedestal part seated between inner side surfaces of the channel layer and an upper pedestal part disposed on the lower pedestal part,
the lower pedestal part has a first region width, and
the upper pedestal part has a second region width less than the first region width and greater than a width of the first portion of the string select channel layer contacting the second portion of the string select channel layer.

13. The semiconductor device of claim 12, wherein:
the first protruding region has a first width greater than a second width of an upper part of the first portion contacting the second portion, and
a third width of a lower part of the first portion contacting the channel layer.

14. The semiconductor device of claim 13, wherein the second protruding region has a fourth width greater than a fifth width of a lower part of the third portion contacting the second portion.

15. The semiconductor device of claim 12, wherein a lower surface of the first portion of the string select channel layer is disposed lower than upper surfaces of the channel layer.

16. A semiconductor device comprising:
gate layers stacked on a substrate;
a channel structure including a channel layer extending through the gate layers; and a string select gate layer disposed on the channel structure and including a string select channel layer extending through the string select gate layer to contact the channel layer, wherein:

the string select channel layer includes:
- a first portion below the string select gate layer including a first protruding region having a first width;
- a second portion extending through the string select gate layer; and
- a third portion above the string select gate layer including a second protruding region having a second width greater than the first width, a lower surface of the first portion of the string select channel layer is disposed lower than upper surfaces of the channel structure, the first portion includes a pedestal protruding region including a lower pedestal part seated between inner side surfaces of the channel structure and an upper pedestal part disposed on the lower pedestal part, the lower pedestal part has a first region width, and the upper pedestal part has a second region width less than the first region width and greater than a width of the first portion of the string select channel layer contacting the second portion of the string select channel layer.

17. The semiconductor device of claim 16, wherein the first protruding region is one of a pedestal protruding region and a plug protruding region.

\* \* \* \* \*